United States Patent
Komazawa

(10) Patent No.: US 12,334,015 B2
(45) Date of Patent: Jun. 17, 2025

(54) LIGHT EMITTING DEVICE, DISPLAY DEVICE, PHOTOELECTRIC CONVERSION DEVICE, ELECTRONIC APPARATUS, ILLUMINATION DEVICE, AND MOVING BODY

(71) Applicant: CANON KABUSHIKI KAISHA, Tokyo (JP)

(72) Inventor: Akihito Komazawa, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 18/597,103

(22) Filed: Mar. 6, 2024

(65) Prior Publication Data
US 2024/0312408 A1    Sep. 19, 2024

(30) Foreign Application Priority Data

Mar. 15, 2023    (JP) ................. 2023-041080

(51) Int. Cl.
*G09G 3/3233*    (2016.01)
*H10K 59/131*    (2023.01)

(52) U.S. Cl.
CPC ......... *G09G 3/3233* (2013.01); *H10K 59/131* (2023.02); *G09G 2300/0842* (2013.01); *G09G 2320/0223* (2013.01); *G09G 2320/0233* (2013.01); *G09G 2320/043* (2013.01); *G09G 2330/02* (2013.01)

(58) Field of Classification Search
CPC ......... G09G 3/3233; G09G 2300/0842; G09G 2320/0223; G09G 2320/0233; G09G 2320/043; G09G 2330/02; H10K 59/131
See application file for complete search history.

(56) References Cited

U.S. PATENT DOCUMENTS

| | | | |
|---|---|---|---|
| 11,842,682 B2 | 12/2023 | Komazawa | |
| 2007/0229428 A1* | 10/2007 | Nakagawa | G09G 3/3233 345/92 |
| 2011/0012817 A1* | 1/2011 | Nakamura | G09G 3/3233 345/80 |
| 2014/0078233 A1* | 3/2014 | Yamashita | G09G 3/3233 347/118 |
| 2018/0181242 A1 | 6/2018 | Mizuhashi | |
| 2021/0242292 A1* | 8/2021 | Tsuboi | G09G 3/3233 |
| 2022/0336562 A1 | 10/2022 | Shang | |
| 2023/0343292 A1 | 10/2023 | Komazawa | |

FOREIGN PATENT DOCUMENTS

| | | |
|---|---|---|
| JP | 2010-145579 A | 7/2010 |
| JP | 2010-224390 A | 10/2010 |

* cited by examiner

*Primary Examiner* — Michael Pervan
(74) *Attorney, Agent, or Firm* — Venable LLP

(57) ABSTRACT

A light emitting device including a pixel that includes a current path including a light emitting element and a driving transistor is provided. The pixel further includes a first switching transistor arranged between the path and a first power line, a second switching transistor arranged between the path and a second power line, and a write transistor to write a luminance signal in the gate. A potential of the first power line is lower than that of the second power line. One frame period includes a write period in which the write transistor is rendered conductive to write the luminance signal, and a light emission period. In the write period, the second switching transistor is rendered conductive while the write transistor is rendered conductive, and in the light emission period, the first switching transistor is rendered conductive.

17 Claims, 14 Drawing Sheets

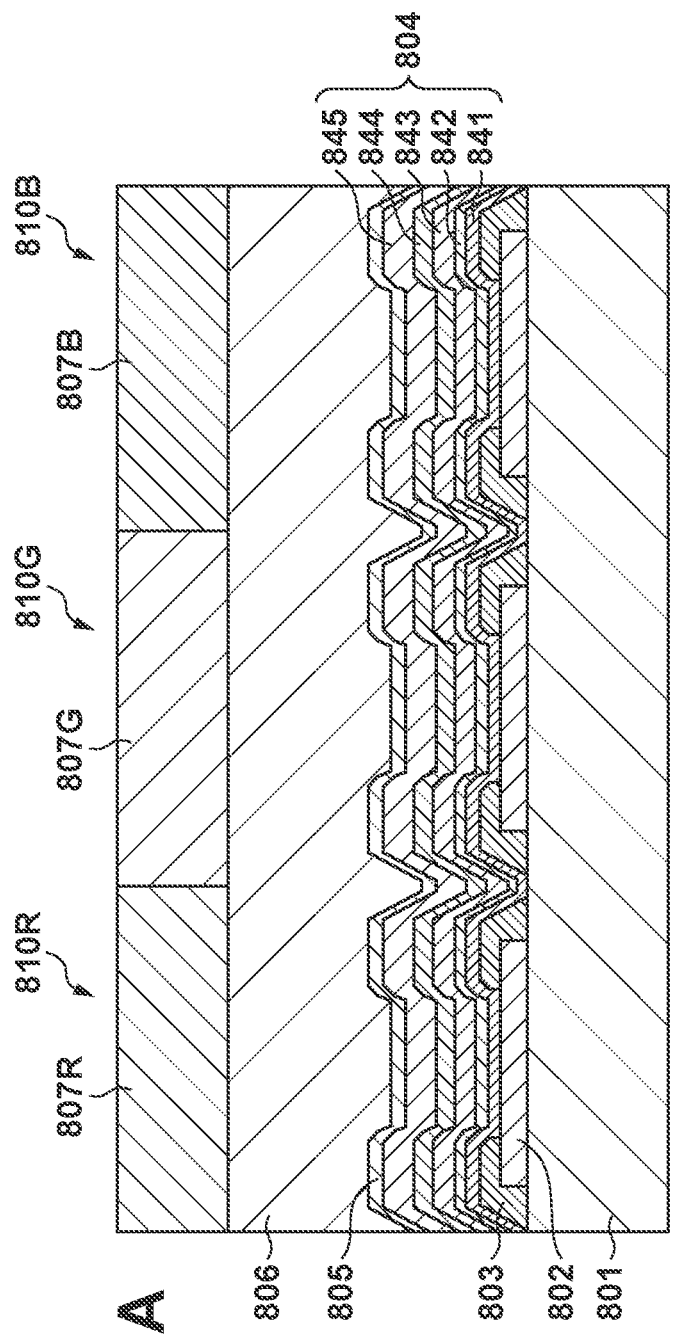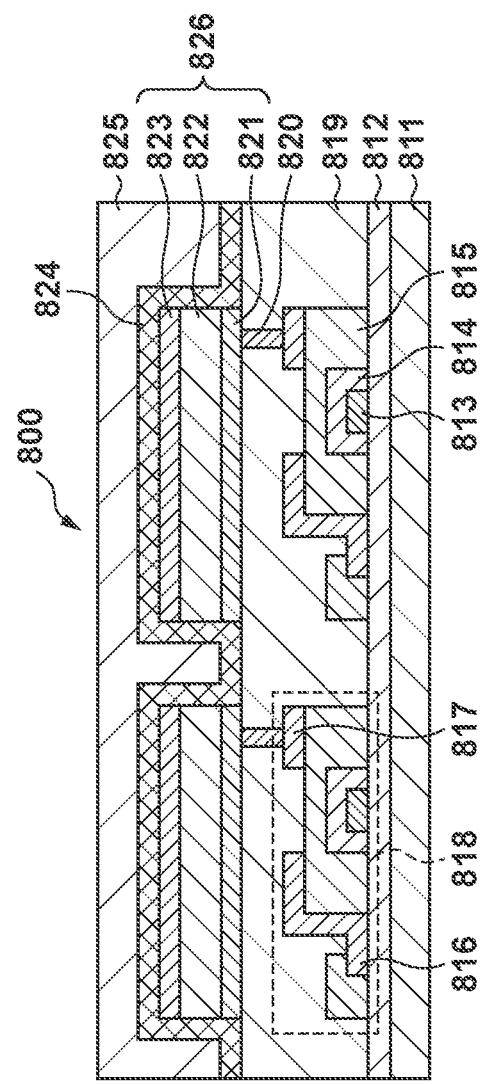

LIGHT EMITTING DEVICE, DISPLAY DEVICE, PHOTOELECTRIC CONVERSION DEVICE, ELECTRONIC APPARATUS, ILLUMINATION DEVICE, AND MOVING BODY

BACKGROUND OF THE INVENTION

Field of the Invention

The present invention relates to a light emitting device, a display device, a photoelectric conversion device, an electronic apparatus, an illumination device, and a moving body.

Description of the Related Art

Japanese Patent Laid-Open No. 2010-145579 describes a pixel that includes a driving transistor which drives a light emitting element in accordance with a video signal, a switching transistor which supplies a driving current to the driving transistor, and a capacitive element connected between the gate electrode and source electrode of the driving transistor.

SUMMARY OF THE INVENTION

If the characteristic of the element such as the transistor or the capacitive element arranged in the pixel varies, display quality can be deteriorated. There is a demand for an arrangement that can suppress the deterioration of display quality even if the characteristic of the element varies.

Some embodiments of the present invention provide a technique advantageous in suppressing a deterioration of display quality.

According to some embodiments, a light emitting device comprising a pixel that includes a current path including a light emitting element and a driving transistor configured to supply a current corresponding to a luminance signal to the light emitting element, and a capacitive element arranged between a gate and a source of the driving transistor, wherein the pixel further includes a first switching transistor arranged between the current path and a first power supply line configured to supply a current to the light emitting element, a second switching transistor arranged between the current path and a second power supply line configured to supply a current to the light emitting element, and a write transistor configured to write the luminance signal in the gate, a potential of the first power supply line is lower than a potential of the second power supply line, one frame period includes a write period in which the write transistor is rendered conductive to write the luminance signal in the gate, and a light emission period in which the light emitting element is caused to emit light after the write period, in the write period, the second switching transistor is rendered conductive while the write transistor is rendered conductive, and in the light emission period, the first switching transistor is rendered conductive, is provided.

Further features of the present invention will become apparent from the following description of exemplary embodiments (with reference to the attached drawings).

BRIEF DESCRIPTION OF THE DRAWINGS

FIGS. 11A and 11B are sectional views showing an example of the arrangement of a pixel of the light emitting device according to the embodiment;

DESCRIPTION OF THE EMBODIMENTS

Figure 1:
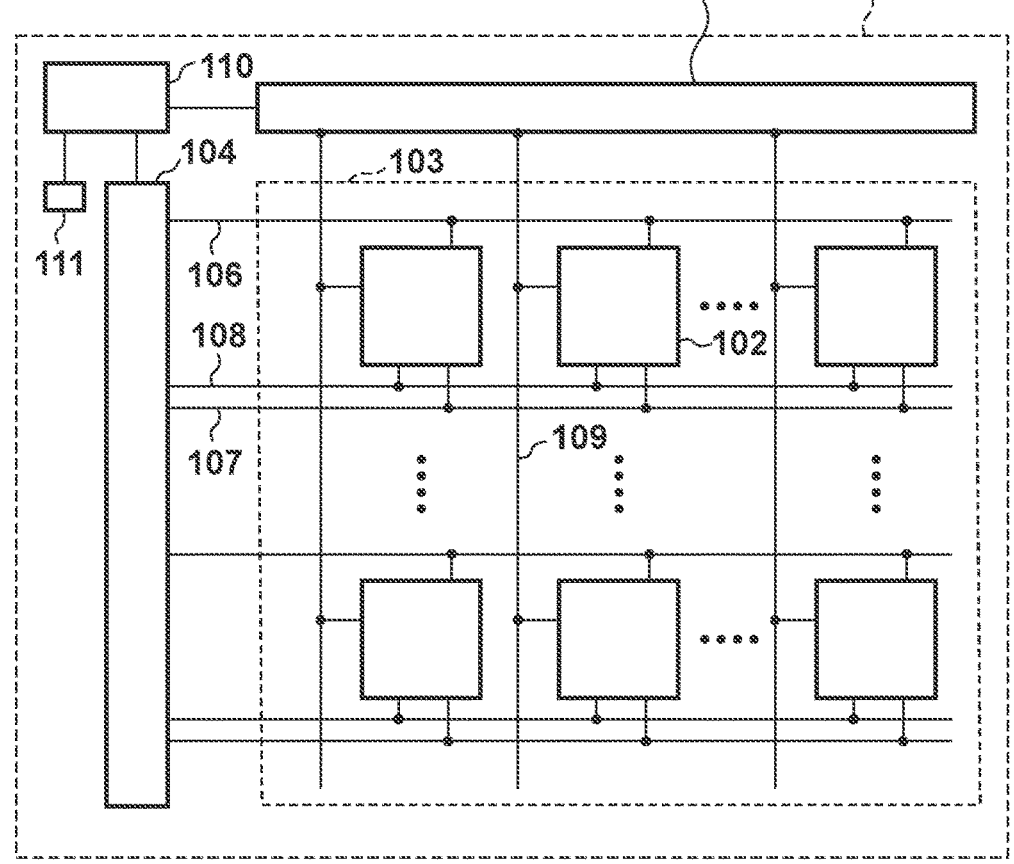
FIG. 1 is a block diagram showing an example of the arrangement of a light emitting device according to an embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

With reference to FIGS. 1 to 10, a light emitting device according to an embodiment of the present disclosure will be described. In the embodiment described below, an organic electroluminescence (EL) element is arranged as a light emitting element in a pixel included in the light emitting device, and a driving transistor configured to supply a current corresponding to a luminance signal to the light emitting element is connected to the anode of the light emitting element. A case will be described in which all transistors arranged in the pixel are p-type (p-channel) transistors. However, the arrangement of the pixel is not limited to this. For example, the polarity and conductivity type may all be reversed. Alternatively, for example, the driving transistor may be a p-type transistor, and the other transistors may be n-type transistors. In accordance with the combination of the polarity and conductivity type, the supplied potential and connection may be changed. Further, the light emitting element is not limited to the organic EL element, and may be an inorganic EL element, a semiconductor laser element, a light emitting diode (LED), or the like.

FIG. 1 is a block diagram showing an example of the arrangement of a light emitting device 101 according to the embodiment. As shown in FIG. 1, the light emitting device 101 includes a pixel array portion 103, and a driver arranged around the pixel array portion 103. A plurality of pixels 102 are arranged in the pixel array portion 103 so as to form rows and columns. Each pixel 102 includes a light emitting element 201 as will be described later with reference to FIG. 2. The light emitting element 201 may be an organic EL element as described above, and may include an organic layer (organic EL layer) including a light emitting layer between the anode and the cathode. In addition to the light emitting layer, the organic layer may include one or more of a hole injection layer, a hole transport layer, an electron injection layer, and an electron transport layer, as appropriate.

The light emitting device 101 includes the driver for driving each pixel 102. In the arrangement shown in FIG. 1, a vertical scanning circuit 104 and a signal output circuit 105 are arranged as the driver. In the pixel array portion 103, scanning lines 106, 107, and 108 are arranged in the row direction (the horizontal direction in FIG. 1) from the vertical scanning circuit 104 so as to correspond to each pixel row of the pixels 102 arranged in the pixel array portion 103. Further, signal lines 109 are arranged in the column direction (the vertical direction in FIG. 1) from the signal output circuit 105 so as to correspond to each pixel column of the pixels 102 arranged in the pixel array portion 103. Each of the scanning lines 106, 107, and 108 is connected to an output terminal of the vertical scanning circuit 104 in a corresponding row. The signal line 109 is connected to an output terminal of the signal output circuit 105 in a corresponding column.

When writing a luminance signal in each pixel 102 arranged in the pixel array portion 103, the vertical scanning circuit 104 supplies a write control signal to the scanning line 106. The vertical scanning circuit 104 also supplies, to the scanning line 107 and the scanning line 108, a light emission control signal for controlling ON or OFF of light emission of the light emitting element 201 arranged in the pixel 102. The signal output circuit 105 outputs a signal voltage Vsig corresponding to the luminance signal to the signal line 109.

Figure 2:
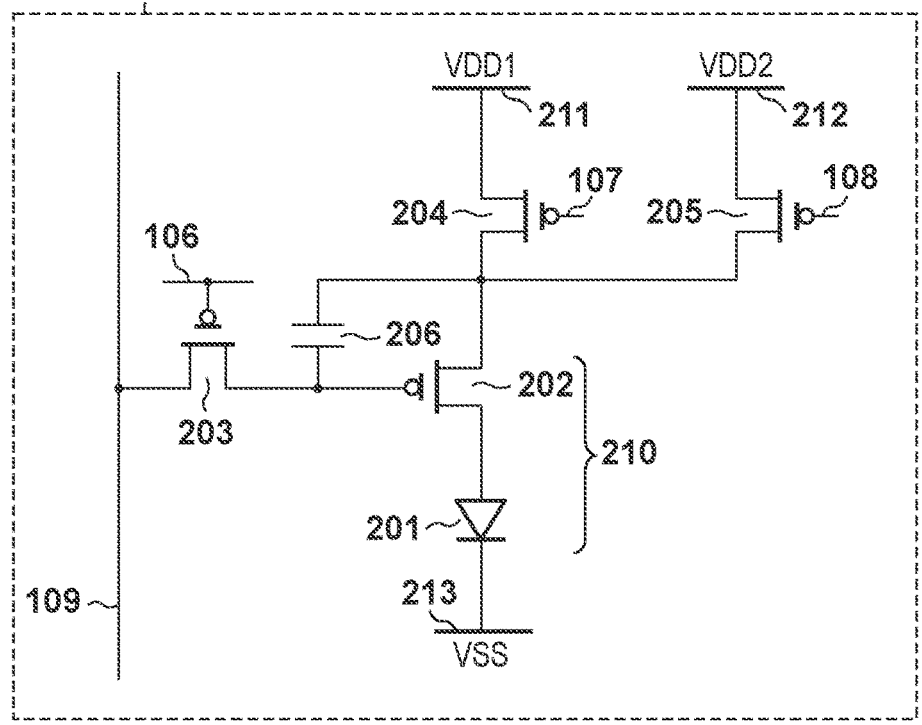
FIG. 2 is a circuit diagram showing an example of the arrangement of a pixel arranged in the light emitting device shown in FIG. 1.

FIG. 2 is a view showing an example of the arrangement of the circuit of each pixel 102 arranged in the light emitting device 101. The pixel 102 includes a current path 210 which includes the light emitting element 201 and a driving transistor 202 for supplying a current corresponding to a luminance signal to the light emitting element 201, and a capacitive element 206 arranged between the gate and source of the driving transistor 202. The drain of the driving transistor 202 is connected to the anode of two electrodes of the light emitting element 201. The cathode of two electrodes of the light emitting element 201 is connected to a power supply line 213. A potential VSS is supplied to the power supply line 213. The pixel 102 further includes a switching transistor 204 arranged between the current path 210 and a power supply line 211 which supplies a current to the light emitting element 201, and a switching transistor 205 arranged between the current path 210 and a power supply line 212 which supplies a current to the light emitting element 201.

The power supply line 211 is supplied with a potential VDD1. The power supply line 212 is supplied with a potential VDD2. The potential VDD1 supplied to the power supply line 211 and the potential VDD2 supplied to the power supply line 212 can be independently set. In other words, the potential VDD1 of the power supply line 211 is different from the potential VDD2 of the power supply line 212. The potential VDD1 supplied to the power supply line 211 and the potential VDD2 supplied to the power supply line 212 can be potentials higher than the potential VSS supplied to the power supply line 213.

The pixel 102 also includes a write transistor 203 for writing the signal voltage Vsig of a luminance signal in the gate of the driving transistor 202. The drain of the write transistor 203 is connected to the gate of the driving transistor 202, and the source of the write transistor 203 is connected to the signal line 109. The gate of the write transistor 203 is connected to the scanning line 106.

As has been described above, the capacitive element 206 is connected between the gate and source of the driving transistor 202. The capacitive element 206 may have, for example, a Metal-Insulator-Metal (MIM) structure.

Figure 3:
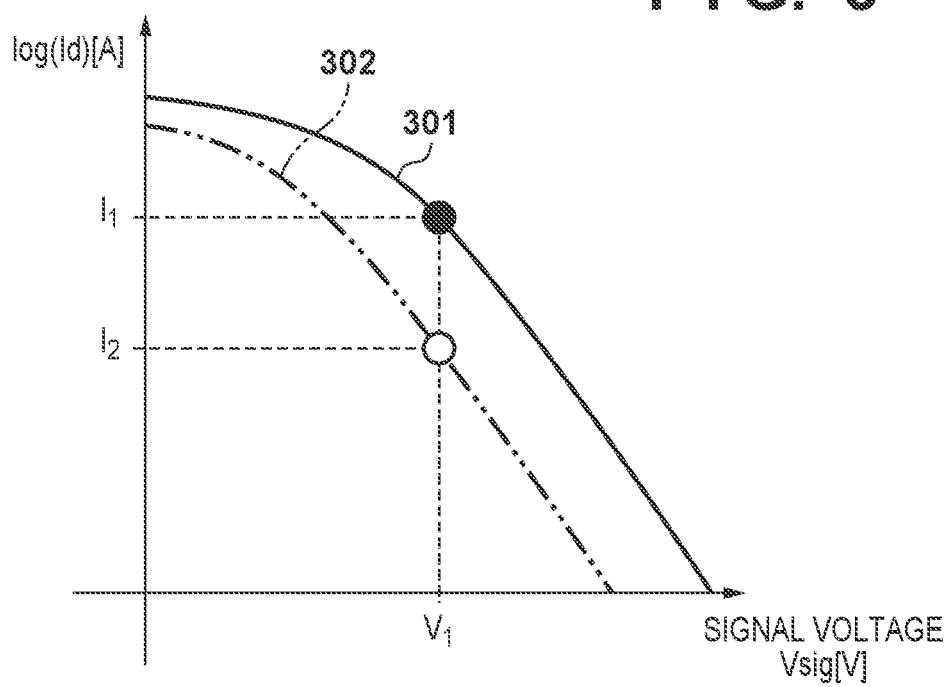
FIG. 3 is a graph showing the Vsig-Id characteristic of a driving transistor of the pixel shown in FIG. 2.

FIG. 3 is a graph showing the relationship (to be sometimes referred to as the Vsig-Id characteristic hereinafter) between the signal voltage Vsig supplied from the signal line 109 to the gate of the driving transistor 202 via the write transistor 203 and a drain current Id flowing through the driving transistor 202. The drain current Id flowing through the driving transistor 202 is a current flowing through the current path 210, and the light emission luminance of the light emitting element 201 is controlled by the drain current Id. A solid line 301 indicates the drain current Id of the driving transistor 202 relative to the signal voltage Vsig in a case in which the capacitance value of the capacitive element 206 is a capacitance value $C_1$. Here, the current value of the drain current Id represented by the ordinate is expressed as a logarithm. A description will be given assuming that, in the characteristic shown in FIG. 3, a current flows from the power supply line 211 via the switching transistor 204.

In the plane of the pixel array portion 103, the capacitance value of the capacitive element 206 may vary among rows. If the capacitance value of the capacitive element 206 decreases, due to charge injection which occurs when the write transistor 203 changes from an ON (conductive) state to an OFF (non-conductive) state or the like, the potential applied to the gate of the driving transistor 202 decreases as compared to the pixel in which the capacitance value of the capacitive element 206 is large. As a result, a gate-source voltage Vgs of the driving transistor 202 decreases, and the drain current Id decreases. An alternate long and two short dashed line 302 represents the Vsig-Id characteristic in a case in which the capacitance value of the capacitive element 206 is a capacitance value $C_2$ smaller than the capacitance value $C_1$. In a case in which an arbitrary signal voltage $V_1$ is written as the signal voltage Vsig in the pixel 102, if the capacitance value of the capacitive element 206 is the capacitance value $C_1$, the drain current Id of the driving transistor 202 is a drain current $I_1$. On the other hand, if the capacitance value of the capacitive element 206 is the capacitance value $C_2$, the drain current Id of the driving transistor 202 is a drain current $I_2$ having a smaller current amount than the drain current $I_1$. In this manner, if the capacitance value of the capacitive element 206 varies, the amount of the drain current Id flowing through the driving transistor 202 changes.

Figure 4:
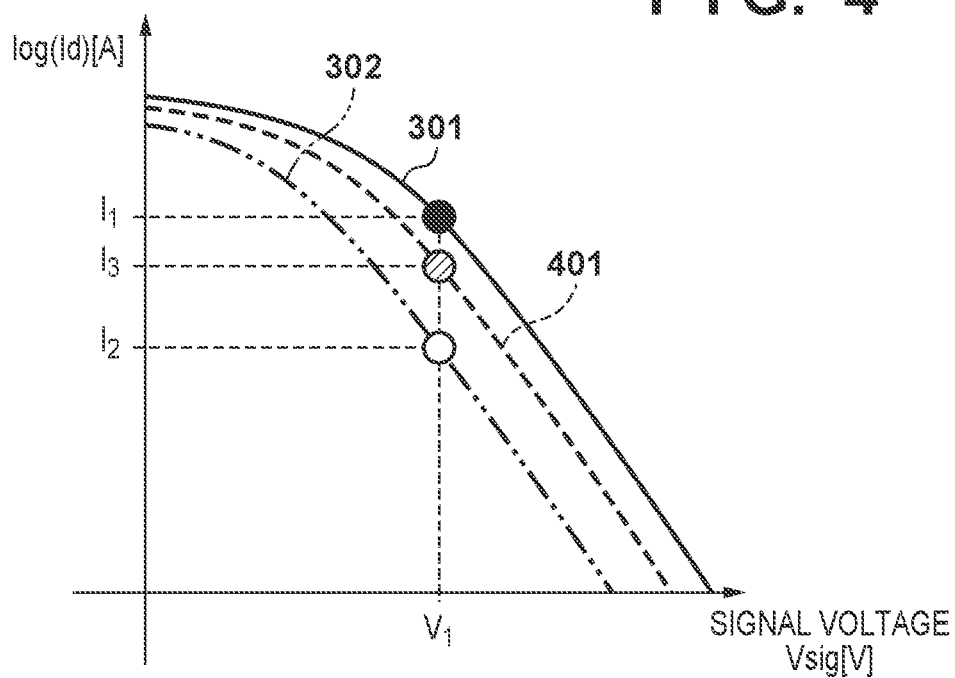
FIG. 4 is a graph showing the Vsig-Id characteristic of the driving transistor of the pixel shown in FIG. 2.

As has been described above, FIG. 3 shows the Vsig-Id characteristic in the case of supplying a current from the power supply line 211 to the light emitting element 201. On the other hand, FIG. 4 shows, in addition to the Vsig-Id characteristic shown in FIG. 3, the Vsig-Id characteristic in a case in which a current flows from the power supply line 212 via the switching transistor 205. A dashed line 401 indicates the Vsig-Id characteristic of the driving transistor 202 in a case in which the capacitance value of the capacitive element 206 is the capacitance value $C_2$ and the light emitting element 201 is operated from the power supply line 212 via the switching transistor 205. The potential VDD2 supplied to the power supply line 212 is set to be higher than the potential VDD1 supplied to the power supply line 211. In other words, the potential VDD1 of the power supply line 211 is lower than the potential VDD2 of the power supply line 212. If the capacitance value $C_1$ is larger than the capacitance value $C_2$ ($C_1 > C_2$), when causing the light emitting element 201 to emit light, a current is caused to flow from the power supply line 212 having the higher potential than the power supply line 211. With this, a source potential Vs of the driving transistor 202 is changed from the potential VDD1 to the potential VDD2, and the gate-source voltage Vgs of the driving transistor 202 can be increased. As a result, when the signal voltage $V_1$ is written in the pixel 102, the drain current Id of the driving transistor 202 is a drain current $I_3$. That is, as compared to a case in which the current flows from the power supply line 211, the drain current Id of the driving transistor 202 increases.

In this manner, in a light emission period in which the light emitting element 201 is caused to emit light, a current may be supplied to the light emitting element arranged in each of the plurality of pixels 102 from the power supply line 211 or the power supply line 212 for each row. Since the vertical scanning circuit 104 supplies, via the scanning lines 107 and 108, a light emission control signal for turning on light emission of the light emitting element 201, in the light emission period, the switching transistor 204 or the switching transistor 205 arranged in each pixel 102 is rendered conductive for each row. In accordance with the capacitance value of the capacitive element 206 arranged in each pixel 102, a current is caused to flow from the power supply line 211 or the power supply line 212, which changes for each row. With this, a difference in the drain current Id of the driving transistor 202 among rows, which is caused by a variation of the capacitance value of the capacitive element 206, is suppressed, and high-quality display is implemented.

In the light emission period, when connecting the pixels 102 arranged in the pixel array portion 103 to the power supply line 211 or the power supply line 212 for each row, the capacitance value of the capacitive element 206 for each row is obtained in advance. Then, it is determined which one of the switching transistor 204 and the switching transistor 205 is to be set in the ON state in the light emission period, and this may be incorporated in an operation program for operating the light emitting device 101. This determination may be based on, for example, comparison between a predetermined threshold and the average value of the capacitance values of the capacitive elements 206 for each row. Alternatively, the switching transistor 204 or 205 to be set in the ON state in the light emission period may be selected in accordance with the number of the capacitive elements 206 whose capacitance values are larger (or smaller) than a predetermined capacitance value. The capacitance values may be obtained or determined in, for example, an inspection step before factory shipment. Alternatively, the capacitance values may be obtained or determined in, for example, a calibration step upon using the light emitting device 101. In this case, the light emitting device 101 may include a measurement circuit for measuring the capacitance value of the capacitive element 206 or comparing the capacitance value with a predetermined threshold.

Alternatively, for example, as shown in FIG. 1, a control circuit 110 and a memory 111 may be arranged in the light emitting device 101. The memory 111 stores capacitance data based on the capacitance value of the capacitive element 206. The capacitance data may be the capacitance value of the capacitive element 206 included in each pixel 102 arranged in the pixel array portion 103. Alternatively, the capacitance data may be, for example, the average value of the capacitance values of the capacitive elements 206 included in the pixels 102, for each row, arranged in the pixel array portion 103. Further, the capacitance data may be, for example, data of "0" or "1" corresponding to the capacitance values of the capacitive elements 206 included in the pixels 102, for each row, arranged in the pixel array portion 103. For example, the control circuit 110 sets the switching transistor 204 in the ON state in the light emission period if the capacitance data is "0", and sets the switching transistor 205 in the ON state in the light emission period if the capacitance data is "1". In the light emission period, the control circuit 110 controls, based on the capacitance data, such that a current is supplied to the light emitting element 201 arranged in each of the plurality of pixels 102 from the power supply line 211 or the power supply line 212 for each row. Consider a case in which the potential VDD1 of the power supply line 211 is lower than the potential VDD2 of the power supply line 212, and the capacitance value $C_1$ of the capacitive element 206 of the pixel arranged in the first row among the plurality of pixels 102 (this can be, for example, the average value of the capacitance values of the capacitive elements 206 of the pixels 102 arranged in the first row) is larger than the capacitance value $C_2$ of the capacitive element 206 of the pixel arranged in the second row among the plurality of pixels 102 (this can be, for example, the average value of the capacitance values of the capacitive elements 206 of the pixels 102 arranged in the second row). In this case, in the light emission period, the control circuit 110 can control, based on the capacitance data, such that a current is supplied from the power supply line 211 to the light emitting element 201 of the pixel arranged in the first low among the plurality of pixels 102, and a current is supplied from the power supply line 212 to the light emitting element 201 of the pixel arranged in the second row among the plurality of pixels 102.

In the arrangement shown in FIG. 1, the example is shown in which the control circuit 110 and the memory 111 are arranged in the light emitting device 101, but the present invention is not limited to this. For example, the light emitting device 101 includes the memory 111 storing the capacitance data and, when operating the light emitting device 101, reads out the capacitance data from the memory 111 to an external control circuit of the light emitting device 101. Then, the external control circuit may decide, based on the readout capacitance data, the row to turn on the switching transistor 204 and the row to turn on the switching transistor 205 in the light emission period.

The operation of supplying a current to the light emitting element from the power supply line 211 or the power supply line 212 has been described above regarding the operation in the light emission period in a case in which the power supply lines 211 and 212 having different potentials are arranged and the capacitance value of the capacitive element 206 varies. However, the effect of arranging the power supply lines 211 and 212, which have different potentials and each of which supplies a current to the light emitting element 201, is not limited to that in the operation in the light emission period described above. Next, an operation in a write period, in which the write transistor 203 is rendered conductive and writes the signal voltage Vsig of a luminance signal in the gate of the driving transistor 202, will be described.

Figure 5:
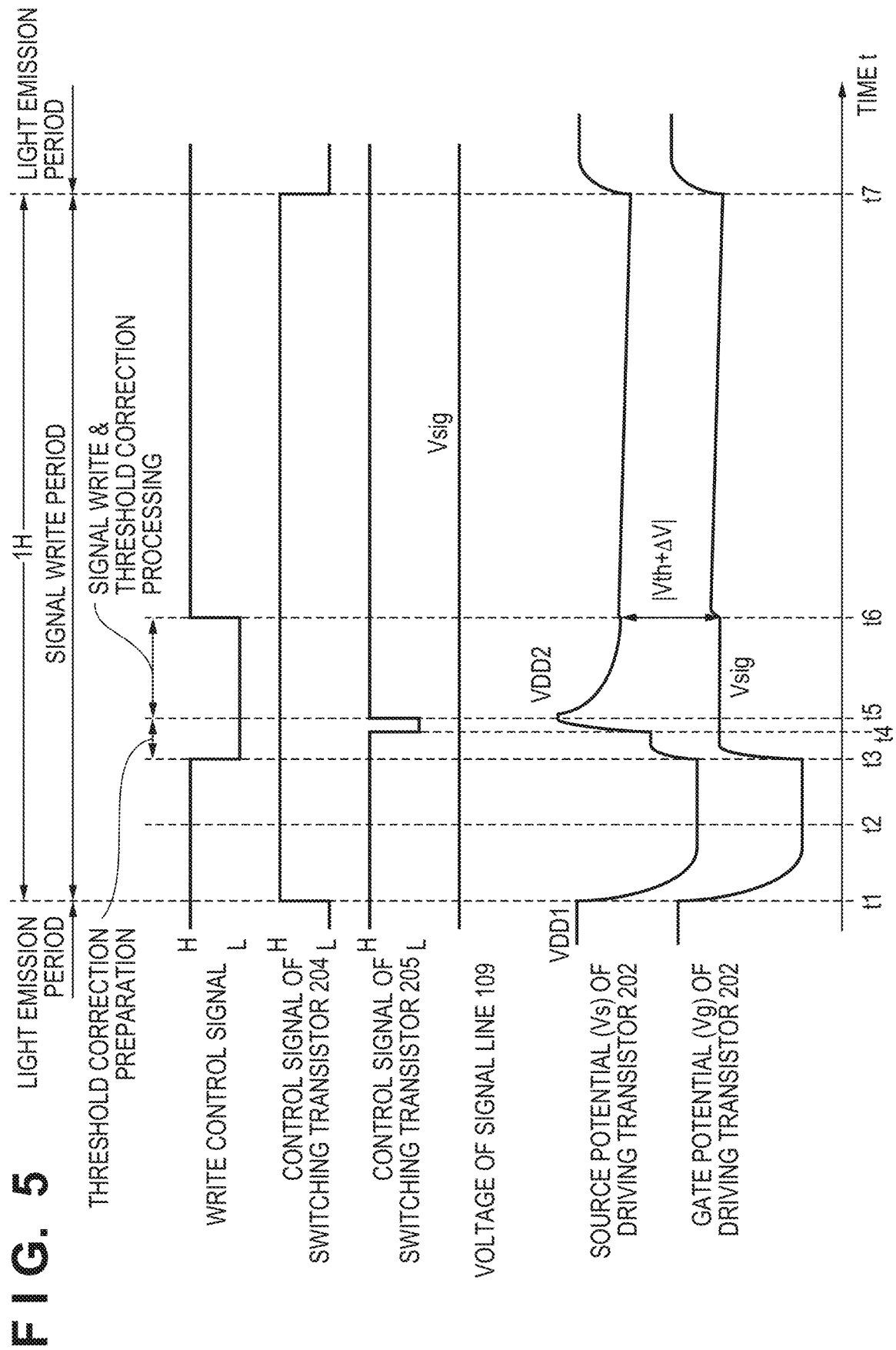
FIG. 5 is a timing chart showing an example of the operation of the pixel shown in FIG. 2.

FIG. 5 is a timing chart showing an example of the operation of the light emitting device 101 according to this embodiment. FIG. 5 shows a write control signal input to the gate of the write transistor 203 via the scanning line 106, a light emission control signal input to the gate of the switching transistor 204 via the scanning line 107, and a light emission control signal input to the gate of the switching transistor 205 via the scanning line 108. Since the write transistor 203 and the switching transistors 204 and 205 are p-type transistors as has been described above, they are set in the OFF state when the signal level is at "H", and set in the ON state when the signal level is at "L". FIG. 5 also shows the voltage of the signal line 109. FIG. 5 further shows the source potential Vs and a gate potential Vg of the driving transistor 202.

In each pixel 102, one frame period includes a write period in which the write transistor 203 is rendered conductive and a luminance signal is written in the gate of the driving transistor 202, and a light emission period in which the light emission element 201 is caused to emit light after the write period. In FIG. 5, one frame period starts from time t1. The period before time t1 is the light emission period of the light emitting element 201 in the preceding frame period. A description will be given assuming that, as in the above description, the potential VDD1 of the power supply line 211 which supplies a current to the current path 210 via the switching transistor 204 is lower than the potential VDD2 of the power supply line 212 which supplies a current to the current path 210 via the switching transistor 205.

In the operation example shown in FIG. 5, in the light emission period, the switching transistor 204 is rendered conductive (ON state), and the write transistor 203 and the switching transistor 205 are set in the OFF state. Accordingly, in the light emission period, a current for causing the light emitting element 201 to emit light is supplied from the power supply line 211.

At time t1, the light emission period in the immediately preceding frame period ends, and the switching transistor 204 transitions to the OFF state. The path between the power supply line 211 and the source of the driving transistor 202 is cut, and no current is supplied to the light emitting element 201, so that the light emitting element 201 is turned off. At time t1, the write transistor 203 and the switching transistor 205 remain in the OFF state.

After a predetermined time elapses from time t1, at time t2, the signal voltage Vsig of a luminance signal is supplied to the signal line 109. In FIG. 5, the voltage of the signal line 109 is constant at the voltage Vsig, but it appropriately changes in accordance with the luminance signal.

Then, at time t3 after a predetermined time elapses from time t2, the write transistor 203 is set in the ON state. When the write transistor 203 is rendered conductive, the signal voltage Vsig of the signal line 109 is written in the gate of the driving transistor 202.

Then, at time t4 while the write transistor 203 is rendered conductive, the switching transistor 205 is rendered conductive. When the switching transistor 205 is set in the ON state, a current flows from the power supply line 212 to the driving transistor 202. With this, a voltage |VDD2−Vsig| is applied as the gate-source voltage Vgs of the driving transistor 202, and the drain current Id flows through the driving transistor 202.

At time t5 while the write transistor 203 maintains the conductive state, the switching transistor 205 transitions to the OFF state. At this time, charges held in the capacitive element 206 are discharged through the path from the driving transistor 202 to the light emitting element 201. As the potential of the source of the driving transistor 202 decreases, the potential difference between the drain and source of the driving transistor 202 reaches about a threshold, and fluctuation of the potential of the source of the driving transistor 202 converges. Thus, threshold correction is performed.

Consider a case in which the power supply line 211 supplied with the potential VDD1 lower than the potential VDD2 is used in threshold correction. To cause the light emitting element 201 to emit light with low luminance, the signal voltage Vsig needs to be set high. In this case, the gate-source voltage Vgs of the driving transistor 202 is a voltage |VDD1−Vsig|. A threshold voltage Vth of the driving transistor 202 may vary among the pixels 102. Therefore, in some pixels 102, the voltage |VDD1−Vsig| applied between the gate and source of the driving transistor 202 may be lower than the threshold voltage |Vth| of the driving transistor 202. Since the threshold voltage Vth of the driving transistor 202 varies, threshold correction is not performed in the pixel 102 in which the voltage |VDD1−Vsig| is lower than the threshold voltage |Vth|. As a result, the drain current Id varies among the pixels 102, and streaks or unevenness may be generated in an image displayed on the light emitting device 101. To prevent this, in threshold correction in the signal write period, electric power is supplied from the power supply line 212 supplied with the potential VDD2 higher than the potential VDD1. With this, the threshold correction processing can be more reliably performed in each pixel 102. As the threshold correction processing proceeds, the source potential Vs of the driving transistor 202 decreases from the potential VDD2 and, after a predetermined time elapses, the gate-source voltage Vgs of the driving transistor 202 reaches a threshold voltage |Vth+ΔV|. Here, ΔV is decided by the difference between the source potential Vs of the driving transistor 202 and the back gate potential.

Then, at time t6, the write transistor 203 is set in the OFF state. With this, writing of the signal voltage Vsig and the threshold voltage correction processing end.

At time t7, the switching transistor 204 is rendered conductive. With this, the potential VDD1 is supplied from the power supply line 211 to the source of the driving transistor 202. The driving transistor 202 supplies the drain current Id corresponding to the gate-source voltage Vgs to the light emitting element 201. This causes the light emitting element 201 to emit light with a light amount corresponding to the signal voltage Vsig of the luminance signal written during the signal write period from t3, and enters the light emission period again.

In the operation described with reference to FIG. 5, if the capacitance value of the capacitive element 206 changes among the pixels 102, a difference is generated in the time until the gate-source voltage Vgs of the driving transistor 202 settles to the threshold voltage |Vth+ΔV| in the period of performing the threshold correction processing. This time difference can be suppressed by, for example, providing a period from time t5 to time t6 sufficient for the gate-source voltage Vgs of the driving transistor 202 to approach the threshold voltage |Vth+ΔV|. Hence, even if the capacitance value of the capacitive element 206 varies, a deterioration in image quality can be suppressed.

Further, in the operation shown in FIG. 5, it has been described that the switching transistor 204 is rendered conductive to supply a current from the power supply line 211 in the light emission period. However, the present invention is not limited to this. As has been described above, the power supply line 211 and the power supply line 212 may be selectively used in accordance with the capacitance value of the capacitive element 206.

Figure 6:
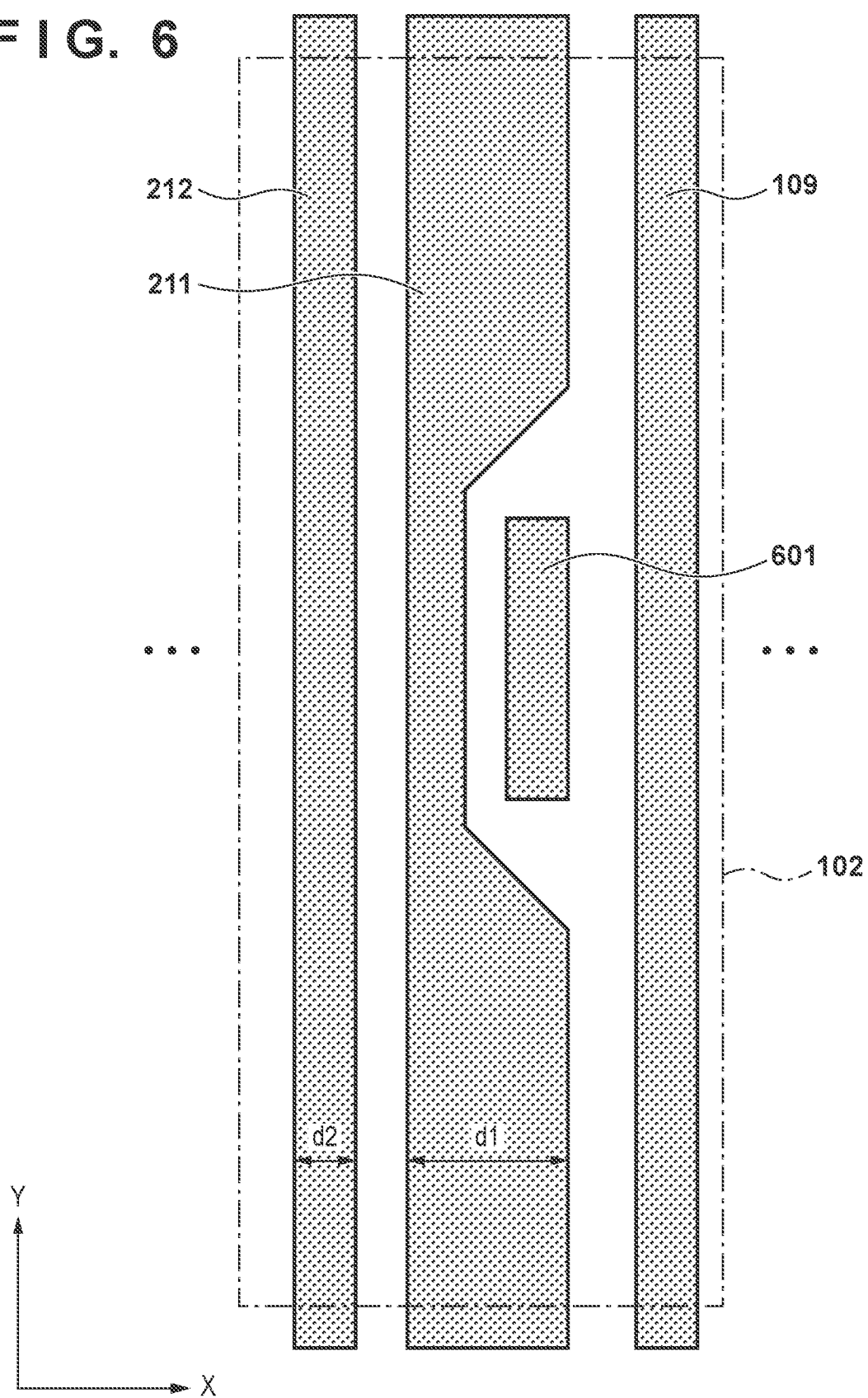
FIG. 6 is a plan view showing an example of the arrangement of the pixel shown in FIG. 2.

FIG. 6 shows an example of the layout of one pixel 102 assuming the operation described with reference to FIG. 5. FIG. 6 shows a pattern including the power supply line 211, the power supply line 212, the signal line 109, and an electrode 601 functioning as the anode of the light emitting element 201. In the pixel 102, the power supply line 211 and the power supply line 212 are arranged in the same wiring layer. Further, in the pixel 102, the power supply line 212 extends along the Y direction in which the power supply line 211 extends.

In the operation shown in FIG. 5, a current constantly flows through the power supply line 211 in the light emission period in which the switching transistor 204 is rendered conductive. On the other hand, a current flows through the power supply line 212 in a short period from time t4 to time t5 in which the switching transistor 205 is rendered conductive. The timing of rendering the switching transistor 205 conductive can be shifted for each row, so that the amount of current flowing through the power supply line 212 is relatively small. On the other hand, in the light emission period, a current corresponding to the light emission luminance flows through the power supply line 211 for each pixel 102. Therefore, in the entire surface of the pixel array portion 103, a voltage drop in the potential VDD1 of the power supply line 211 can occur. The potential VDD1 of the power supply line 211 is supplied, for example, from the outer peripheral portion of the pixel array portion 103 through the power supply line 211, and a current flows for each pixel 102. Hence, a shading luminance distribution is generated in which, depending on the position in the pixel array portion 103, the luminance level of the light emitting element 201 changes with respect to the same luminance signal. For example, in the central portion of the pixel array portion 103, a current flowing through the light emitting element 201 may become smaller than a desired current amount due to the voltage drop.

To prevent this, in the pixel 102, a layout is employed in which a maximum wiring width d1 of the power supply line 211 is larger than a maximum wiring width d2 of the power supply line 212 as shown in FIG. 6. With this, the wiring resistance of the power supply line 211 can be decreased, and luminance shading in the Y direction caused by a voltage drop in the light emission period can be suppressed. Here, the wiring widths d1 and d2 can be the widths of the power supply lines 211 and 212, respectively, in the X direction intersecting the Y direction in which the power supply lines 211 and 212 extend. The X direction may be orthogonal to the Y direction. In the arrangement shown in FIG. 6, the power supply line 211 and the power supply line 212 are arranged in the same wiring layer, but they may be arranged in different wiring layers.

Figure 7:
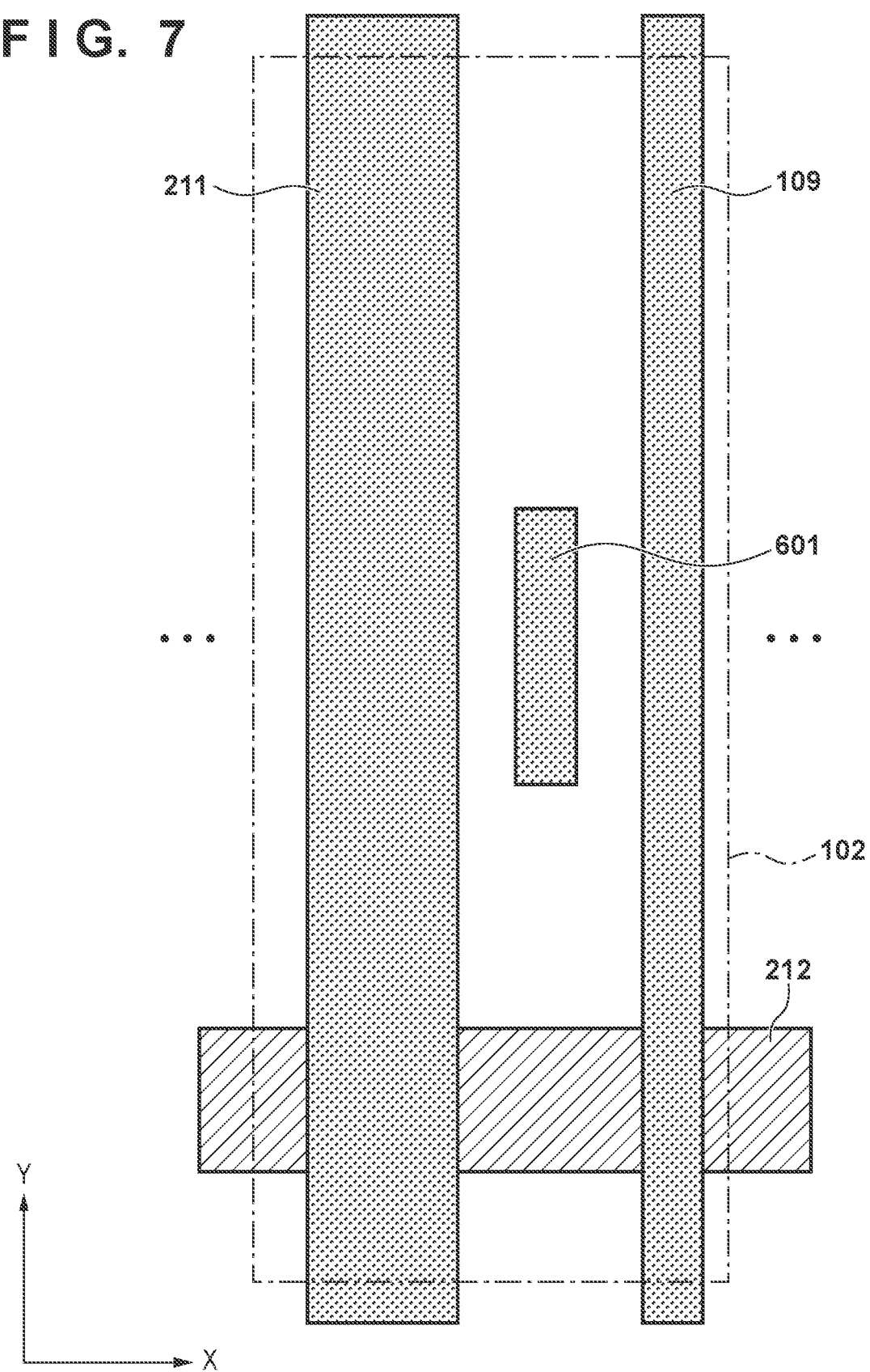
FIG. 7 is a plan view showing an example of the arrangement of the pixel shown in FIG. 2.

FIG. 7 shows an example of another layout of one pixel 102, which is different from the layout shown in FIG. 6. FIG. 7 shows a pattern including the power supply line 211, the power supply line 212, the signal line 109, and the electrode 601 functioning as the anode of the light emitting element 201. In the pixel 102, the power supply line 211 and the power supply line 212 are arranged in different wiring layers. Further, in the pixel 102, the power supply line 211 and the power supply line 212 extend in intersecting directions. In the arrangement shown in FIG. 7, the power supply line 211 extends in the Y direction, and the power supply line 212 extends in the X direction intersecting the Y direction. The X direction may be orthogonal to the Y direction.

Arranging the power supply line 211 and the power supply line 212 in different wiring layers creates more room in the layout of the wiring layer where the power supply line 211 is arranged, so that the wiring width of the power supply line 211 can be increased. When the wiring width of the power supply line 211 increases, the wiring resistance of the power supply line 211 decreases, and the luminance shading in the Y direction caused by a voltage drop in the light emission period can be suppressed. In addition, as compared to the arrangement shown in FIG. 6, the opposing length between the power supply line 211 and the power supply line 212 can be decreased. Thus, the yield in the manufacturing process can be improved. In addition, the arrangement shown in FIG. 7 can also increase the wiring width of the power supply line 212 arranged in a wiring layer different from the wiring layer where the power supply line 211 is arranged. Thus, also in a case of selectively using the power supply line 211 and the power supply line 212 in the light emission period, since the wiring resistance of the power supply line 212 can be decreased, luminance shading in the X direction caused by a voltage drop on the power supply line 212 in the light emission period can be suppressed.

Figure 8:
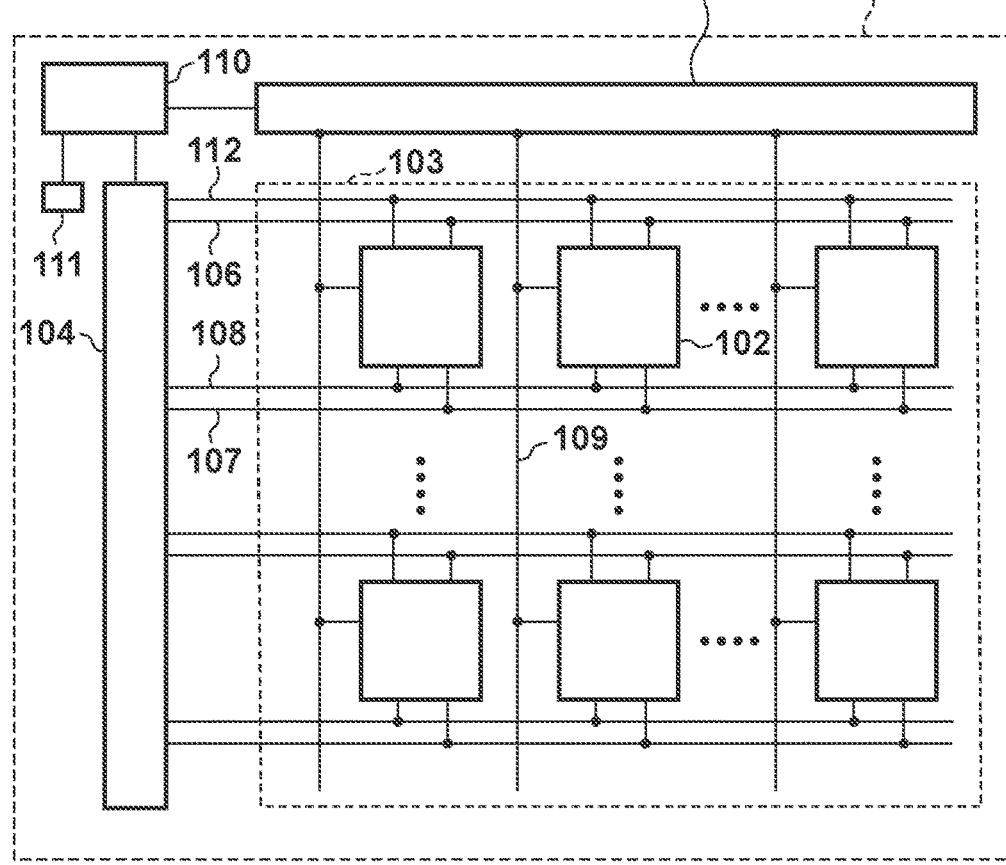
FIG. 8 is a view showing a modification of the light emitting device shown in FIG. 1.

FIG. 8 is a block diagram showing a modification of the light emitting device 101 shown in FIG. 1. In the arrangement shown in FIG. 8, in addition to the arrangement shown in FIG. 1, scanning lines 112 are arranged in the row direction (the horizontal direction in FIG. 8) from the vertical scanning circuit 104 in the pixel array portion 103 so as to correspond to each pixel row of the pixels 102 arranged in the pixel array portion 103. The scanning line 112 is connected to an output terminal in a corresponding row in the vertical scanning circuit 104, and supplies a reset signal to the pixel 102.

Figure 9:
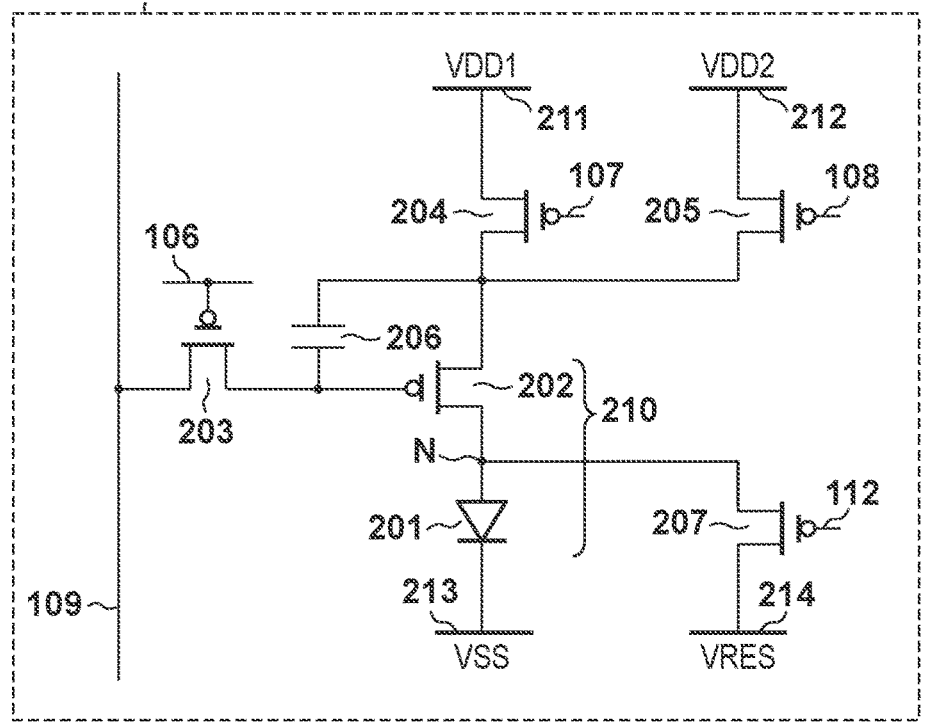
FIG. 9 is a circuit diagram showing an example of the arrangement of a pixel arranged in the light emitting device shown in FIG. 8.

FIG. 9 is a view showing an example of the arrangement of the circuit of the pixel 102 arranged in the light emitting device 101 shown in FIG. 8. As compared to the pixel shown in FIG. 2, a reset transistor 207 is arranged in the pixel 102 shown in FIG. 9. The remaining arrangement may be similar to the above-described arrangement, and the operation may be similar to the operation described above. Therefore, points different from the above-described arrangement and operation will be mainly described here, and a description of the arrangement and operation that may be similar to those described above will be omitted, as appropriate.

As shown in FIG. 9, in the current path 210 including the light emitting element 201 and the driving transistor 202, the anode of the light emitting element 201 and the drain of the driving transistor 202 are connected. The reset transistor 207 resets, to a predetermined potential, a node N to which the anode of the light emitting element 201 and the drain of the driving transistor 202 are connected. As shown in FIG. 9, the drain of the reset transistor 207 is connected to a power supply line 214 supplied with a potential VRES. Therefore, the predetermined potential to which the node N is reset is the potential VRES of the power supply line 214.

The potential VRES is a potential that sets the luminance of the light emitting element 201 to the black level. The potential VRES may be a potential different from the potential VSS of the power supply line 214, or may be equal to the potential VSS. The gate of the reset transistor 207 is connected to the scanning line 112. In the signal write period, a reset signal (if the reset transistor 207 is a p-type transistor, the signal level "L" described above) is supplied via the scanning line 112 to render the reset transistor 207 conductive, thereby connecting the anode of the light emitting element 201 to the potential VRES. With this, charges held in the capacitive element 206 while the switching transistor 205 is rendered conductive in the above-described threshold correction period shown in FIG. 5 are discharged through the path from the driving transistor 202 to the reset transistor 207, so no current flows through the light emitting element 201. That is, in the signal write period, the light emitting element 201 maintains a non-light emission or black level state. Hence, the luminance at the time of black display can be decreased, and the light emitting device 101 with higher contrast can be implemented.

Figure 10:
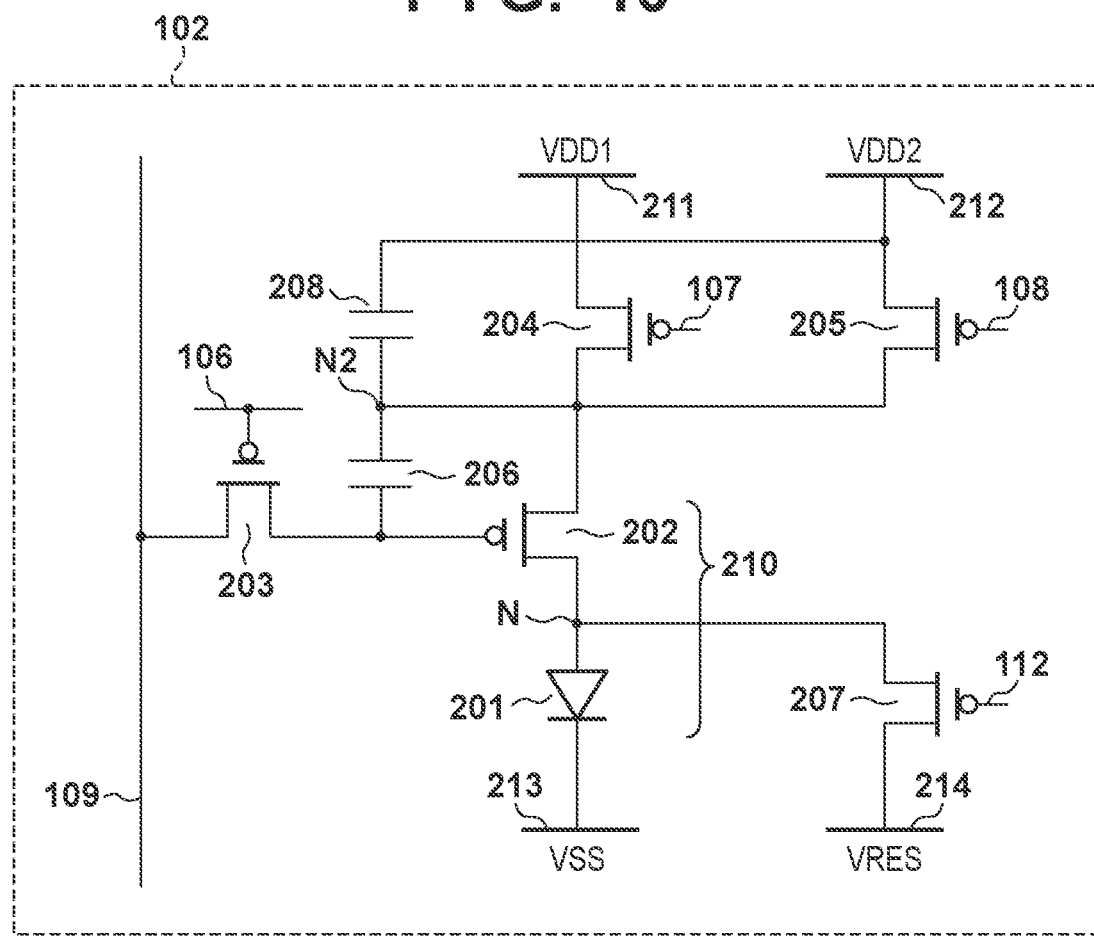
FIG. 10 is a circuit diagram showing an example of the arrangement of a pixel arranged in the light emitting device shown in FIG. 8.

FIG. 10 is a view showing a modification of the pixel 102 shown in FIG. 9. The pixel 102 shown in FIG. 10 further includes a capacitive element 208 which is different from the capacitive element 206 and arranged between the power supply line 212 and a node N2 connecting the source of the driving transistor 202 and the capacitive element 206. When the capacitive element 208 is arranged, the capacitance value of the source of the driving transistor 202 increases in the threshold correction processing shown in FIG. 5. Therefore, for example, it is possible to suppress the noise component flowing through the power supply line 211 that causes the source potential Vs of the driving transistor 202 to fluctuate due to capacitive coupling. Luminance unevenness generated by the fluctuation of the source potential Vs of the driving transistor 202 can be suppressed, so that display with higher quality can be implemented in the light emitting device 101. The capacitive element 208 may be arranged in the pixel 102 shown in FIG. 2.

Here, application examples in which the light emitting device 101 according to the embodiment is applied to an image forming device, a display device, a photoelectric conversion device, an electronic apparatus, an illumination device, a moving body, and a wearable device will be described with reference to FIGS. 11A and 11B to 19A and 19B. The description will be given assuming that, for example, an organic light emitting element such as an organic EL element is arranged as the light emitting element 201 in the pixel 102 arranged in the pixel array portion 103 of the light emitting device 101 as has been described above. Details of each component arranged in the pixel array portion 103 of the light emitting device 101 described above will be described first, and the application examples will be described after that.

Configuration of Organic Light Emitting Element

The organic light emitting element is provided by forming an insulating layer, a first electrode, an organic compound layer, and a second electrode on a substrate. A protection layer, a color filter, a microlens, and the like may be provided on a cathode. If a color filter is provided, a planarizing layer may be provided between the protection layer and the color filter. The planarizing layer can be formed using acrylic resin or the like. The same applies to a case in which a planarizing layer is provided between the color filter and the microlens.

Substrate

Quartz, glass, a silicon wafer, a resin, a metal, or the like may be used as a substrate. Furthermore, a switching element such as a transistor, a wiring pattern, and the like may be provided on the substrate, and an insulating layer may be provided thereon. The insulating layer may be made of any material as long as a contact hole can be formed so that the wiring pattern can be formed between the first electrode and the substrate and insulation from the unconnected wiring pattern can be ensured. For example, a resin such as polyimide, silicon oxide, silicon nitride, or the like may be used for the insulating layer.

Electrode

A pair of electrodes can be used as the electrodes. The pair of electrodes can be an anode and a cathode. If an electric field is applied in the direction in which the organic light emitting element emits light, the electrode having a high potential is the anode, and the other is the cathode. It can also be said that the electrode that supplies holes to the light emitting layer is the anode and the electrode that supplies electrons is the cathode.

As the constituent material of the anode, a material having a large work function may be selected. For example, a metal such as gold, platinum, silver, copper, nickel, palladium, cobalt, selenium, vanadium, or tungsten, a mixture containing some of them, an alloy obtained by combining some of them, or a metal oxide such as tin oxide, zinc oxide, indium oxide, indium tin oxide (ITO), or zinc indium oxide can be used. Furthermore, a conductive polymer such as polyaniline, polypyrrole, or polythiophene can also be used as the constituent material of the anode.

One of these electrode materials may be used singly, or two or more of them may be used in combination. The anode may be formed by a single layer or a plurality of layers.

If the electrode is used as a reflective electrode, for example, chromium, aluminum, silver, titanium, tungsten, molybdenum, an alloy thereof, a stacked layer thereof, or the like can be used. The above materials can function as a reflective film having no role as an electrode. If a transparent electrode is used as the electrode, an oxide transparent conductive layer made of indium tin oxide (ITO), indium zinc oxide, or the like can be used, but the present invention is not limited thereto. A photolithography technique can be used to form the electrode.

On the other hand, as the constituent material of the cathode, a material having a small work function may be selected. Examples of the material include an alkali metal such as lithium, an alkaline earth metal such as calcium, a metal such as aluminum, titanium, manganese, silver, lead, or chromium, and a mixture containing some of them. Alternatively, an alloy obtained by combining these metals can also be used. For example, a magnesium-silver alloy, an aluminum-lithium alloy, an aluminum-magnesium alloy, a silver-copper alloy, a zinc-silver alloy, or the like can be used. A metal oxide such as indium tin oxide (ITO) can also be used. One of these electrode materials may be used singly, or two or more of them may be used in combination. The cathode may have a single-layer structure or a multilayer structure. Silver may be used as the cathode. To suppress aggregation of silver, a silver alloy may be used. The ratio of the alloy is not limited as long as aggregation of silver can be suppressed. For example, the ratio between silver and another metal may be 1:1, 3:1, or the like.

The cathode may be a top emission element using an oxide conductive layer made of ITO or the like, or may be a bottom emission element using a reflective electrode made of aluminum (Al) or the like, and is not particularly limited. The method of forming the cathode is not particularly limited, but if direct current sputtering or alternating current sputtering is used, the good coverage is achieved for the film to be formed, and the resistance of the cathode can be lowered.

Pixel Isolation Layer

A pixel isolation layer may be formed by a so-called silicon oxide, such as silicon nitride (SiN), silicon oxynitride (SiON), or silicon oxide (SiO), formed using a Chemical Vapor Deposition (CVD) method. To increase the resistance in the in-plane direction of the organic compound layer, the organic compound layer, especially the hole transport layer may be thinly deposited on the side wall of the pixel isolation layer. More specifically, the organic compound layer can be deposited so as to have a thin film thickness on the side wall by increasing the taper angle of the side wall of the pixel isolation layer or the film thickness of the pixel isolation layer to increase vignetting during vapor deposition.

On the other hand, the taper angle of the side wall of the pixel isolation layer or the film thickness of the pixel isolation layer can be adjusted to the extent that no space is formed in the protection layer formed on the pixel isolation layer. Since no space is formed in the protection layer, it is possible to reduce generation of defects in the protection layer. Since generation of detects in the protection layer is reduced, a decrease in reliability caused by generation of a dark spot or occurrence of a conductive failure of the second electrode can be reduced.

According to this embodiment, even if the taper angle of the side wall of the pixel isolation layer is not acute, it is possible to effectively suppress leakage of charges to an adjacent pixel. As a result of this consideration, it has been found that the taper angle of 60° (inclusive) to 90° (inclusive) can sufficiently reduce the occurrence of defects. The film thickness of the pixel isolation layer may be 10 nm (inclusive) to 150 nm (inclusive). A similar effect can be obtained in a configuration including only pixel electrodes without the pixel isolation layer. However, in this case, the film thickness of the pixel electrode is set to be equal to or smaller than half the film thickness of the organic layer or the end portion of the pixel electrode is formed to have a forward tapered shape of less than 60°. With this, short circuit of the organic light emitting element can be reduced.

Furthermore, in a case where the first electrode is the cathode and the second electrode is the anode, a high color gamut and low-voltage driving can be achieved by forming the electron transport material and charge transport layer and forming the light emitting layer on the charge transport layer.

Organic Compound Layer

The organic compound layer may be formed by a single layer or a plurality of layers. If the organic compound layer includes a plurality of layers, the layers can be called a hole injection layer, a hole transport layer, an electron blocking layer, a light emitting layer, a hole blocking layer, an electron transport layer, and an electron injection layer in accordance with the functions of the layers. The organic compound layer is mainly formed from an organic compound but may contain inorganic atoms and an inorganic compound. For example, the organic compound layer may contain copper, lithium, magnesium, aluminum, iridium, platinum, molybdenum, zinc, or the like. The organic compound layer may be arranged between the first and second electrodes, and may be arranged in contact with the first and second electrodes.

Protection Layer

A protection layer may be provided on the cathode. For example, by adhering glass provided with a moisture absorbing agent on the cathode, permeation of water or the like into the organic compound layer can be suppressed and occurrence of display defects can be suppressed. Furthermore, as another embodiment, a passivation layer made of silicon nitride or the like may be provided on the cathode to suppress permeation of water or the like into the organic compound layer. For example, the protection layer can be formed by forming the cathode, transferring it to another chamber without breaking the vacuum, and forming silicon nitride having a thickness of 2 µm by the CVD method. The protection layer may be provided using an atomic layer deposition (ALD) method after deposition of the protection layer using the CVD method. The material of the protection layer by the ALD method is not limited but can be silicon nitride, silicon oxide, aluminum oxide, or the like. Silicon nitride may further be formed by the CVD method on the protection layer formed by the ALD method. The protection layer formed by the ALD method may have a film thickness smaller than that of the protection layer formed by the CVD method. More specifically, the film thickness of the protection layer formed by the ALD method may be 50% or less, or 10% or less of that of the protection layer formed by the CVD method.

Color Filter

A color filter may be provided on the protection layer. For example, a color filter considering the size of the organic light emitting element may be provided on another substrate, and the substrate with the color filter formed thereon may be bonded to the substrate with the organic light emitting element provided thereon. Alternatively, for example, a color filter may be patterned on the above-described protection layer using a photolithography technique. The color filter may be formed from a polymeric material.

Planarizing Layer

A planarizing layer may be arranged between the color filter and the protection layer. The planarizing layer is provided to reduce unevenness of the layer below the planarizing layer. The planarizing layer may be called a material resin layer without limiting the purpose of the layer. The planarizing layer may be formed from an organic compound, and may be made of a low-molecular material or a polymeric material. In consideration of reduction of unevenness, a polymeric organic compound may be used for the planarizing layer.

The planarizing layers may be provided above and below the color filter. In that case, the same or different constituent materials may be used for these planarizing layers. More specifically, examples of the material of the planarizing layer include polyvinyl carbazole resin, polycarbonate resin, polyester resin, ABS resin, acrylic resin, polyimide resin, phenol resin, epoxy resin, silicone resin, and urea resin.

Microlens

The organic light emitting device may include an optical member such as a microlens on the light emission side. The microlens can be made of acrylic resin, epoxy resin, or the like. The microlens can aim to increase the amount of light extracted from the organic light emitting device and control the direction of light to be extracted. The microlens can have a hemispherical shape. If the microlens has a hemispherical shape, among tangents contacting the hemisphere, there is a tangent parallel to the insulating layer, and the contact between the tangent and the hemisphere is the vertex of the microlens. The vertex of the microlens can be decided in the same manner even in an arbitrary sectional view. That is, among tangents contacting the semicircle of the microlens in a sectional view, there is a tangent parallel to the insulating layer, and the contact between the tangent and the semicircle is the vertex of the microlens.

Furthermore, the middle point of the microlens can also be defined. In the section of the microlens, a line segment from a point at which an arc shape ends to a point at which another arc shape ends is assumed, and the middle point of the line segment can be called the middle point of the microlens. A section for determining the vertex and the middle point may be a section perpendicular to the insulating layer.

The microlens includes a first surface including a convex portion and a second surface opposite to the first surface. The second surface can be arranged on the functional layer (light emitting layer) side of the first surface. For this configuration, the microlens needs to be formed on the light emitting device. If the functional layer is an organic layer, a process which produces high temperature in the manufacturing step of the microlens may be avoided. In addition, if it is configured to arrange the second surface on the functional layer side of the first surface, all the glass transition temperatures of an organic compound forming the organic layer may be 100° C. or more. For example, 130° C. or more is suitable.

Counter Substrate

A counter substrate may be arranged on the planarizing layer. The counter substrate is called a counter substrate because it is provided at a position corresponding to the above-described substrate. The constituent material of the counter substrate can be the same as that of the above-described substrate. If the above-described substrate is the first substrate, the counter substrate can be the second substrate.

Organic Layer

The organic compound layer (hole injection layer, hole transport layer, electron blocking layer, light emitting layer, hole blocking layer, electron transport layer, electron injection layer, and the like) forming the organic light emitting element according to an embodiment of the present disclosure may be formed by the method to be described below.

The organic compound layer forming the organic light emitting element according to the embodiment of the present disclosure can be formed by a dry process using a vacuum deposition method, an ionization deposition method, a sputtering method, a plasma method, or the like. Instead of the dry process, a wet process that forms a layer by dissolving a solute in an appropriate solvent and using a well-known coating method (for example, a spin coating method, a dipping method, a casting method, an LB method, an inkjet method, or the like) can be used.

Here, when the layer is formed by a vacuum deposition method, a solution coating method, or the like, crystallization or the like hardly occurs and excellent temporal stability is obtained. Furthermore, when the layer is formed using a coating method, it is possible to form the film in combination with a suitable binder resin.

Examples of the binder resin include polyvinyl carbazole resin, polycarbonate resin, polyester resin, ABS resin, acrylic resin, polyimide resin, phenol resin, epoxy resin, silicone resin, and urea resin. However, the binder resin is not limited to them.

One of these binder resins may be used singly as a homopolymer or a copolymer, or two or more of them may be used in combination. Furthermore, additives such as a well-known plasticizer, antioxidant, and an ultraviolet absorber may also be used as needed.

Pixel Circuit

The light emitting device can include a pixel circuit connected to the light emitting element. The pixel circuit may be an active matrix circuit that individually controls light emission of the first and second light emitting elements. The active matrix circuit may be a voltage or current programing circuit. A driving circuit includes a pixel circuit for each pixel. The pixel circuit can include a light emitting element, a transistor for controlling light emission luminance of the light emitting element, a transistor for controlling a light emission timing, a capacitor for holding the gate voltage of the transistor for controlling the light emission luminance, and a transistor for connection to GND without intervention of the light emitting element.

The light emitting device includes a display region and a peripheral region arranged around the display region. The light emitting device includes the pixel circuit in the display region and a display control circuit in the peripheral region. The mobility of the transistor forming the pixel circuit may be smaller than that of a transistor forming the display control circuit.

The slope of the current-voltage characteristic of the transistor forming the pixel circuit may be smaller than that of the current-voltage characteristic of the transistor forming the display control circuit. The slope of the current-voltage characteristic can be measured by a so-called Vg-Ig characteristic.

The transistor forming the pixel circuit is a transistor connected to the light emitting element such as the first light emitting element.

Pixel

The organic light emitting device includes a plurality of pixels. Each pixel includes sub-pixels that emit light components of different colors. The sub-pixels may include, for example, R, G, and B emission colors, respectively.

In each pixel, a region also called a pixel opening emits light. The pixel opening can have a size of 5 µm (inclusive) to 15 µm (inclusive). More specifically, the pixel opening can have a size of 11 µm, 9.5 µm, 7.4 µm, 6.4 µm, or the like.

A distance between the sub-pixels can be 10 µm or less, and can be, more specifically, 8 µm, 7.4 µm, or 6.4 µm.

The pixels can have a known arrangement form in a plan view. For example, the pixels may have a stripe arrangement, a delta arrangement, a pentile arrangement, or a Bayer arrangement. The shape of each sub-pixel in a plan view may be any known shape. For example, a quadrangle such as a rectangle or a rhombus, a hexagon, or the like may be possible. A shape which is not a correct shape but is close to a rectangle is included in a rectangle, as a matter of course. The shape of the sub-pixel and the pixel arrangement can be used in combination.

Application of Organic Light Emitting Element of Embodiment of Present Disclosure The organic light emitting element according to an embodiment of the present disclosure can be used as a constituent member of a display device or an illumination device. In addition, the organic light emitting element is applicable to the exposure light source of an electrophotographic image forming device, the backlight of a liquid crystal display device, a light emitting device including a color filter in a white light source, and the like.

The display device may be an image information processing device that includes an image input unit for inputting image information from an area CCD, a linear CCD, a memory card, or the like, and an information processing unit for processing the input information, and displays the input image on a display unit.

In addition, a display unit included in an image capturing device or an inkjet printer can have a touch panel function. The driving type of the touch panel function may be an infrared type, a capacitance type, a resistive film type, or an electromagnetic induction type, and is not particularly limited. The display device may be used for the display unit of a multifunction printer.

More details will be described next with reference to the accompanying drawings. FIG. 11A shows an example of a pixel as a constituent element of the above-described pixel array portion 103. The pixel includes sub-pixels 810 (pixels 102). The sub-pixels are divided into sub-pixels 810R, 810G, and 810B by emitted light components. The light emission colors may be discriminated by the wavelengths of light components emitted from the light emitting layers, or light emitted from each sub-pixel may be selectively transmitted or undergo color conversion by a color filter or the like. Each sub-pixel includes a reflective electrode 802 as the first electrode on an interlayer insulating layer 801, an insulating layer 803 covering the end of the reflective electrode 802, an organic compound layer 804 covering the first electrode and the insulating layer, a transparent electrode 805 as the second electrode, a protection layer 806, and a color filter 807.

The interlayer insulating layer 801 can include a transistor and a capacitive element arranged in the interlayer insulating layer 801 or a layer below it. The transistor and the first electrode can electrically be connected via a contact hole (not shown) or the like.

The insulating layer 803 can also be called a bank or a pixel isolation film. The insulating layer 803 covers the end of the first electrode, and is arranged to surround the first electrode. A portion of the first electrode where no insulating layer 803 is arranged is in contact with the organic compound layer 804 to form a light emitting region.

The organic compound layer 804 includes a hole injection layer 841, a hole transport layer 842, a first light emitting layer 843, a second light emitting layer 844, and an electron transport layer 845.

The second electrode may be a transparent electrode, a reflective electrode, or a semi-transmissive electrode.

The protection layer 806 suppresses permeation of water into the organic compound layer. The protection layer is shown as a single layer but may include a plurality of layers. Each layer can be an inorganic compound layer or an organic compound layer.

The color filter 807 is divided into color filters 807R, 807G, and 807B by colors. The color filters can be formed on a planarizing film (not shown). A resin protection layer (not shown) may be arranged on the color filters. The color filters can be formed on the protection layer 806. Alternatively, the color filters can be provided on the counter substrate such as a glass substrate, and then the substrate may be bonded.

A display device 800 (corresponding to the above-described light emitting device 101) shown in FIG. 11B is provided with an organic light emitting element 826 and a TFT 818 as an example of a transistor. A substrate 811 of glass, silicon, or the like is provided and an insulating layer 812 is provided on the substrate 811. The active element such as the TFT 818 is arranged on the insulating layer, and a gate electrode 813, a gate insulating film 814, and a semiconductor layer 815 of the active element are arranged. The TFT 818 further includes the semiconductor layer 815, a drain electrode 816, and a source electrode 817. An insulating film 819 is provided on the TFT 818. The source electrode 817 and an anode 821 forming the organic light emitting element 826 are connected via a contact hole 820 formed in the insulating film.

A method of electrically connecting the electrodes (anode and cathode) included in the organic light emitting element 826 and the electrodes (source electrode and drain electrode) included in the TFT is not limited to that shown in FIG. 11B. That is, one of the anode and cathode and one of the source electrode and drain electrode of the TFT are electrically connected. The TFT indicates a thin-film transistor.

In the display device 800 shown in FIG. 11B, an organic compound layer is illustrated as one layer. However, an organic compound layer 822 may include a plurality of layers. A first protection layer 824 and a second protection layer 825 are provided on a cathode 823 to suppress deterioration of the organic light emitting element.

A transistor is used as a switching element in the display device 800 shown in FIG. 11B but may be used as another switching element.

The transistor used in the display device 800 shown in FIG. 11B is not limited to a transistor using a single-crystal silicon wafer, and may be a thin-film transistor including an active layer on an insulating surface of a substrate. Examples of the active layer include single-crystal silicon, amorphous silicon, non-single-crystal silicon such as microcrystalline silicon, and a non-single-crystal oxide semiconductor such as indium zinc oxide and indium gallium zinc oxide. Note that a thin-film transistor is also called a TFT element.

The transistor included in the display device 800 shown in FIG. 11B may be formed in the substrate such as a silicon substrate. Forming the transistor in the substrate means forming the transistor by processing the substrate such as a silicon substrate. That is, when the transistor is included in the substrate, it can be considered that the substrate and the transistor are formed integrally.

The light emission luminance of the organic light emitting element according to this embodiment can be controlled by the TFT which is an example of a switching element, and the plurality of organic light emitting elements can be provided in a plane to display an image with the light emission luminances of the respective elements. Here, the switching element according to this embodiment is not limited to the TFT, and may be a transistor formed from low-temperature polysilicon or an active matrix driver formed on the substrate such as a silicon substrate. The term "on the substrate" may mean "in the substrate". Whether to provide a transistor in the substrate or use a TFT is selected based on the size of the display unit. For example, if the size is about 0.5 inch, the organic light emitting element may be provided on the silicon substrate.

Figure 12A:
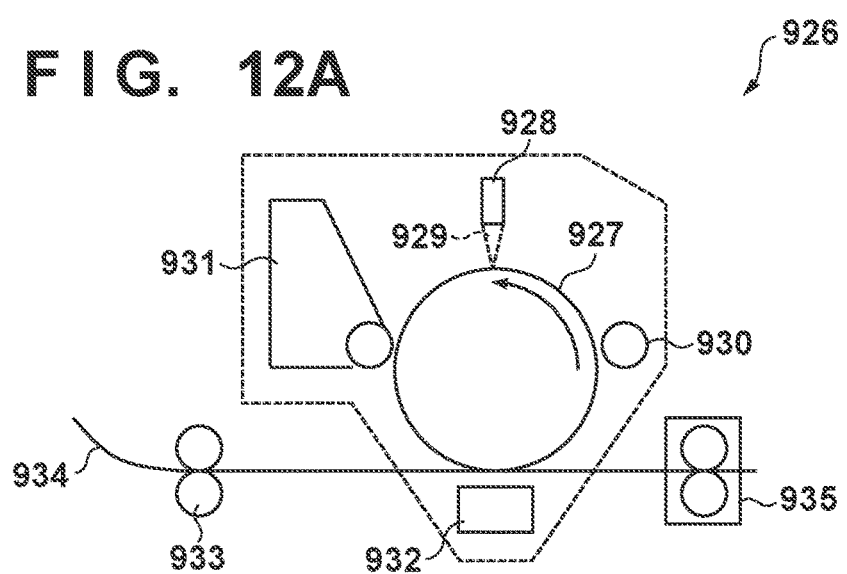
FIGS. 12A to 12C are views showing an example of an image forming device using the light emitting device according to the embodiment.
Figure 12B:
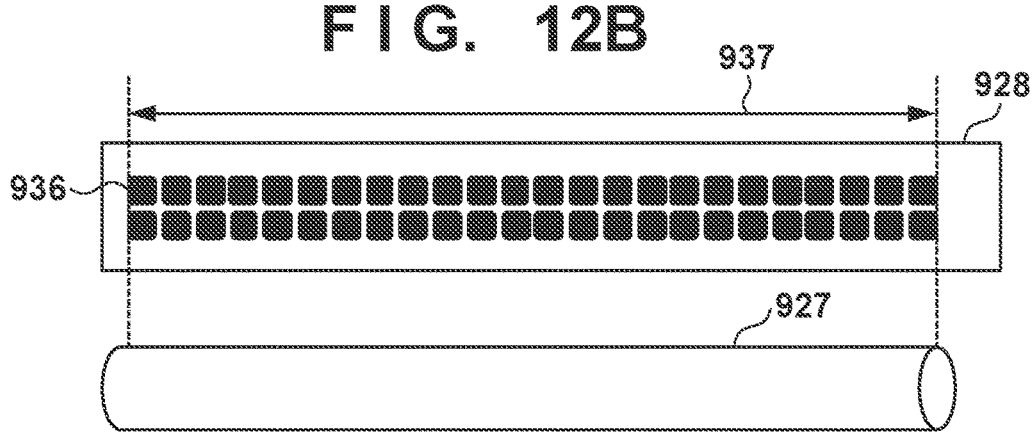
Figure 12C:
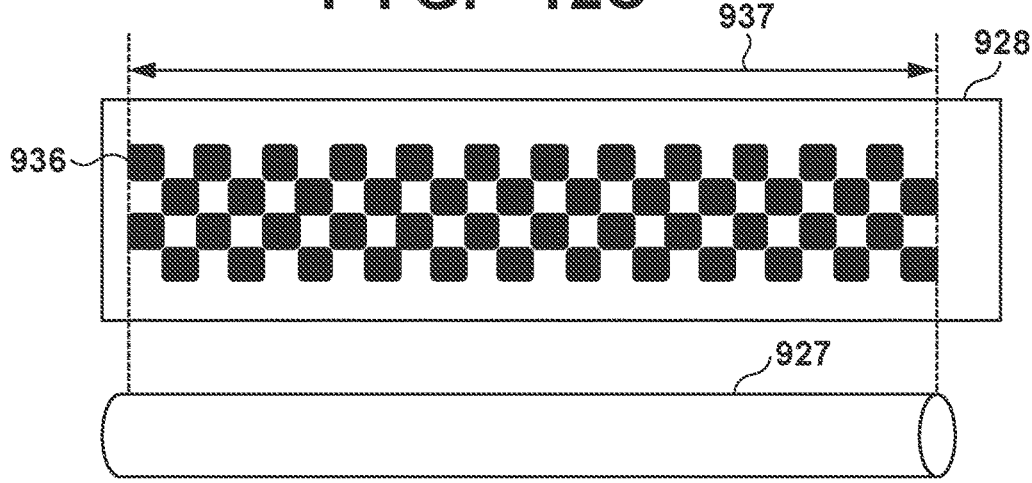

FIGS. 12A to 12C are schematic views showing an example of an image forming device using the light emitting device 101 according to this embodiment. An image forming device 926 shown in FIG. 12A includes a photosensitive member 927, an exposure light source 928, a developing unit 931, a charging unit 930, a transfer device 932, a conveyance unit 933 (a conveyance roller in the configuration shown in FIG. 12A), and a fixing device 935.

Light 929 is emitted from the exposure light source 928, and an electrostatic latent image is formed on the surface of the photosensitive member 927. The light emitting device 101 can be applied to the exposure light source 928. The developing unit 931 can function as a developing device that contains a toner or the like as a developing agent and applies the developing agent to the exposed photosensitive member 927. The charging unit 930 charges the photosensitive member 927. The transfer device 932 transfers the developed image to a print medium 934. The conveyance unit 933 conveys the print medium 934. The print medium 934 can be, for example, paper or a film. The fixing device 935 fixes the image formed on the print medium.

Each of FIGS. 12B and 12C is a schematic view showing a plurality of light emitting units 936 arranged along the longitudinal direction on a long substrate in the exposure light source 928. The light emitting device 101 can be applied to the light emitting units 936. That is, the plurality of pixels 102 arranged in the pixel array portion 103 are arranged along the longitudinal direction of the substrate. A direction 937 is a direction parallel to the axis of the photosensitive member 927. This column direction matches the direction of the axis upon rotating the photosensitive member 927. This direction 937 can be referred to as the long-axis direction of the photosensitive member 927.

FIG. 12B shows a form in which the light emitting units 936 are arranged along the long-axis direction of the photosensitive member 927. FIG. 12C shows a form, which is a modification of the arrangement of the light emitting units 936 shown in FIG. 12B, in which the light emitting units 936 are arranged in the column direction alternately between the first column and the second column. The light emitting units 936 are arranged at different positions in the row direction between the first column and the second column. In the first column, multiple light emitting units 936 are arranged spaced apart from each other. In the second column, the light emitting unit 936 is arranged at the position corresponding to the gap between the light emitting units 936 in the first column. Also in the row direction, multiple light emitting units 936 are arranged spaced apart from each other. The arrangement of the light emitting units 936 shown in FIG. 12C can be referred to as, for example, an arrangement in a grid pattern, an arrangement in a staggered pattern, or an arrangement in a checkered pattern.

Figure 13:
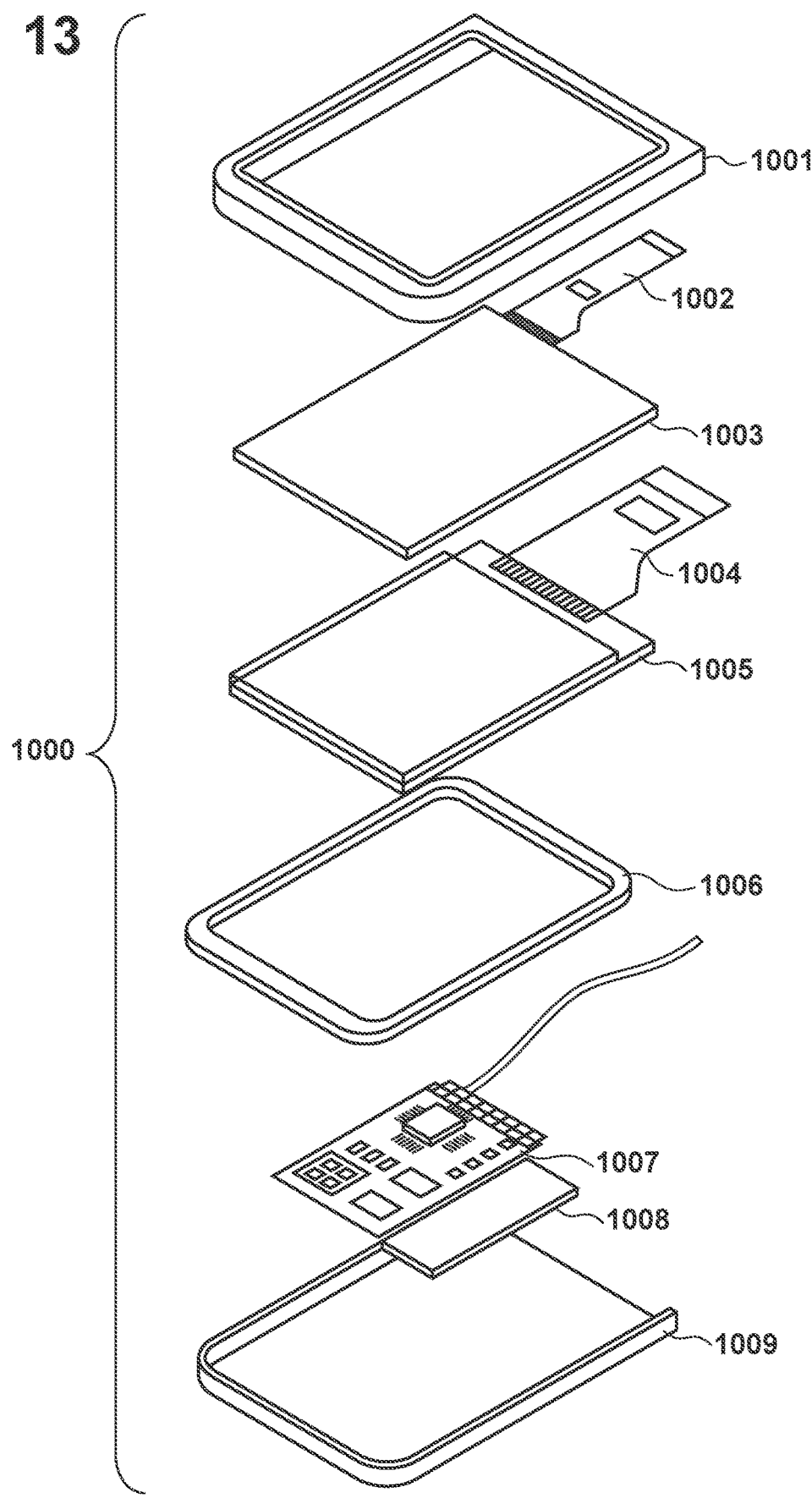
FIG. 13 is a view showing an example of a display device using the light emitting device according to the embodiment.

FIG. 13 is a schematic view showing an example of the display device using the light emitting device 101 of this embodiment. A display device 1000 can include a touch panel 1003, a display panel 1005, a frame 1006, a circuit board 1007, and a battery 1008 between an upper cover 1001 and a lower cover 1009. Flexible printed circuits (FPCs) 1002 and 1004 are respectively connected to the touch panel 1003 and the display panel 1005. Active elements such as transistors are arranged on the circuit board 1007. The battery 1008 is unnecessary if the display device 1000 is not a portable apparatus. Even when the display device 1000 is a portable apparatus, the battery 1008 need not be provided at this position. The light emitting device 101 can be applied to the display panel 1005. The pixels 102 arranged in the pixel array portion 103 of the light emitting device 101 functioning as the display panel 1005 operate in a state in which they are connected to the active elements such as transistors arranged on the circuit board 1007.

The display device 1000 shown in FIG. 13 can be used for a display unit of a photoelectric conversion device (also referred to as an image capturing device) including an optical unit having a plurality of lenses, and an image sensor for receiving light having passed through the optical unit and photoelectrically converting the light into an electric signal. The photoelectric conversion device can include a display unit for displaying information acquired by the image sensor. In addition, the display unit can be either a display unit exposed outside the photoelectric conversion device, or a display unit arranged in the finder. The photoelectric conversion device can be a digital camera or a digital video camera.

Figure 14:
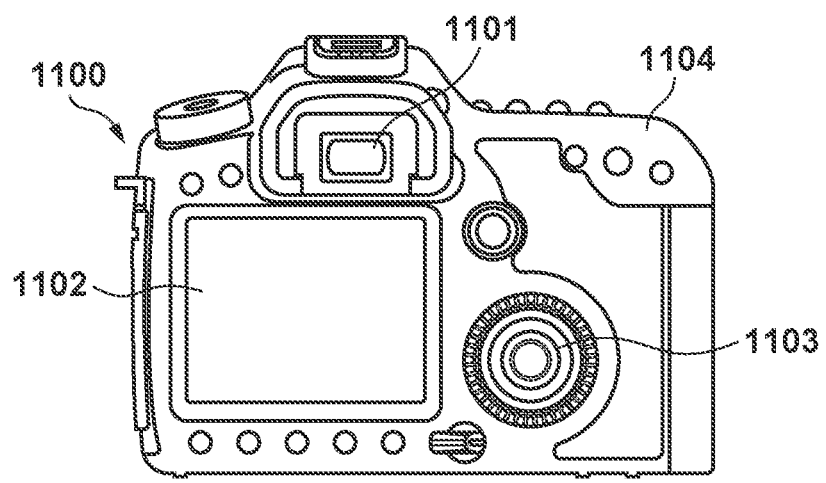
FIG. 14 is a view showing an example of a photoelectric conversion device using the light emitting device according to the embodiment.

FIG. 14 is a schematic view showing an example of the photoelectric conversion device using the light emitting device 101 of this embodiment. A photoelectric conversion device 1100 can include a viewfinder 1101, a rear display 1102, an operation unit 1103, and a housing 1104. The photoelectric conversion device 1100 can also be called an image capturing device. The light emitting device 101 according to this embodiment can be applied to the viewfinder 1101 or the rear display 1102 as a display unit. In this case, the pixel array portion 103 of the light emitting device 101 can display not only an image to be captured but also environment information, image capturing instructions, and the like. Examples of the environment information are the intensity and direction of external light, the moving velocity of an object, and the possibility that an object is covered with an obstacle.

The timing suitable for image capturing is a very short time in many cases, so the information should be displayed as soon as possible. Therefore, the light emitting device 101 in which the pixel 102 including the light emitting element using the organic light emitting material such as an organic EL element is arranged in the pixel array portion 103 may be used for the viewfinder 1101 or the rear display 1102. This is so because the organic light emitting material has a high response speed. The light emitting device 101 using the organic light emitting material can be used for the devices that require a high display speed more suitably than for the liquid crystal display device.

The photoelectric conversion device 1100 includes an optical unit (not shown). This optical unit has a plurality of lenses, and forms an image on a photoelectric conversion element (not shown) that receives light having passed through the optical unit and is accommodated in the housing 1104. The focal points of the plurality of lenses can be adjusted by adjusting the relative positions. This operation can also automatically be performed.

The light emitting device 101 may be applied to a display unit of an electronic apparatus. At this time, the display unit can have both a display function and an operation function. Examples of the portable terminal are a portable phone such as a smartphone, a tablet, and a head mounted display.

Figure 15:
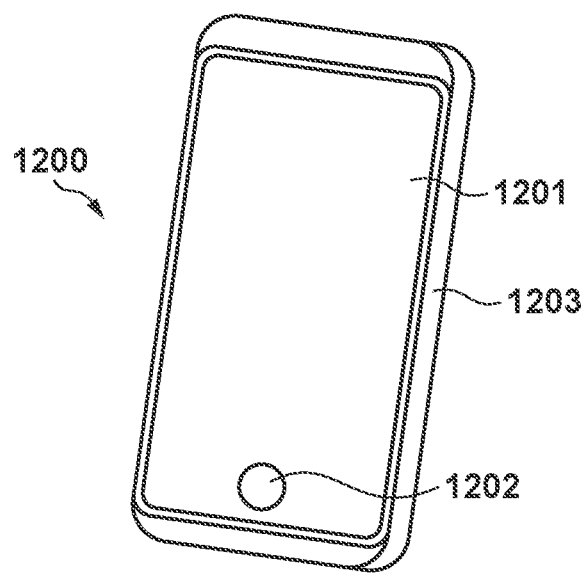
FIG. 15 is a view showing an example of an electronic apparatus using the light emitting device according to the embodiment.

FIG. 15 is a schematic view showing an example of an electronic apparatus using the light emitting device 101 of this embodiment. An electronic apparatus 1200 includes a display unit 1201, an operation unit 1202, and a housing 1203. The housing 1203 can accommodate a circuit, a printed board having this circuit, a battery, and a communication unit. The operation unit 1202 can be a button or a touch-panel-type reaction unit. The operation unit 1202 can also be a biometric authentication unit that performs unlocking or the like by authenticating the fingerprint. The portable apparatus including the communication unit can also be regarded as a communication apparatus. The light emitting device 101 according to this embodiment can be applied to the display unit 1201.

Figure 16A:
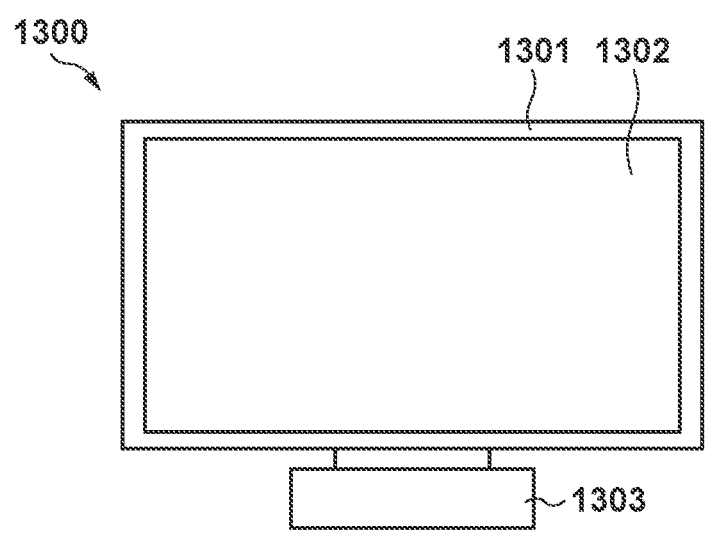
FIGS. 16A and 16B are views each showing an example of a display device using the light emitting device according to the embodiment.
Figure 16B:
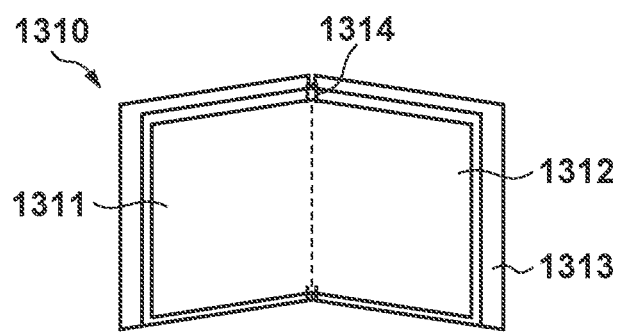

FIGS. 16A and 16B are schematic views showing examples of the display device using the light emitting device 101 of this embodiment. FIG. 16A shows a display device such as a television monitor or a PC monitor. A display device 1300 includes a frame 1301 and a display unit 1302. The light emitting device 101 according to this embodiment can be applied to the display unit 1302. The display device 1300 can include a base 1303 that supports the frame 1301 and the display unit 1302. The base 1303 is not limited to the form shown in FIG. 16A. For example, the lower side of the frame 1301 may also function as the base 1303. In addition, the frame 1301 and the display unit 1302 can be bent. The radius of curvature in this case can be 5,000 mm (inclusive) to 6,000 mm (inclusive).

FIG. 16B is a schematic view showing another example of the display device using the light emitting device 101 of this embodiment. A display device 1310 shown in FIG. 16B can be folded, and is a so-called foldable display device. The display device 1310 includes a first display unit 1311, a second display unit 1312, a housing 1313, and a bending point 1314. The light emitting device 101 according to this embodiment can be applied to each of the first display unit 1311 and the second display unit 1312. The first display unit 1311 and the second display unit 1312 can also be one seamless display device. The first display unit 1311 and the second display unit 1312 can be divided by the bending point. The first display unit 1311 and the second display unit 1312 can display different images, and can also display one image together.

Figure 17:
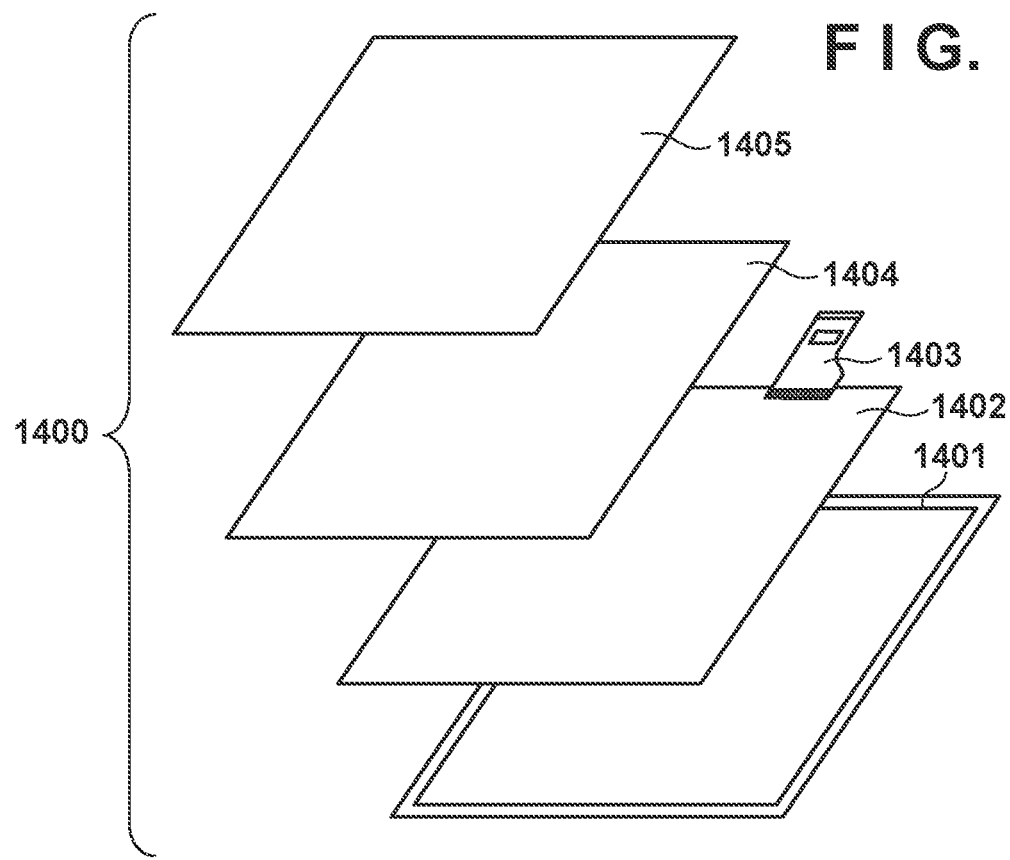
FIG. 17 is a view showing an example of an illumination device using the light emitting device according to the embodiment.

FIG. 17 is a schematic view showing an example of an illumination device using the light emitting device 101 according to this embodiment. An illumination device 1400 may include a housing 1401, a light source 1402, a circuit board 1403, an optical film 1404, and a light diffusion unit 1405. The light emitting device 101 according to this embodiment can be applied to the light source 1402. The optical film 1404 may be a filter that improves the color rendering property of the light source. The light diffusion unit 1405 can effectively diffuse light from the light source to illuminate a wide range for lighting up or the like. A cover may be provided in the outermost portion, as needed. The illumination device 1400 may include both the optical film 1404 and the light diffusion unit 1405, or may include only one of them.

The illumination device 1400 is, for example, a device that illuminates a room. The illumination device 1400 may emit light of white, day white, or any other color from blue to red. The illumination device 1400 may include a light control circuit for controlling the light color. The illumination device 1400 may include a power supply circuit connected to the light emitting device 101 which functions as the light source 1402. The power supply circuit is a circuit that converts an AC voltage into a DC voltage. Note that white light has a color temperature of 4200K, and day-white light has a color temperature of 5000K. The illumination device 1400 may also include a color filter. Further, the illumination device 1400 may include a heat dissipation portion. The heat dissipation portion releases the heat in the device to the outside of the device, and examples thereof include a metal having high specific heat, liquid silicon, and the like.

Figure 18:
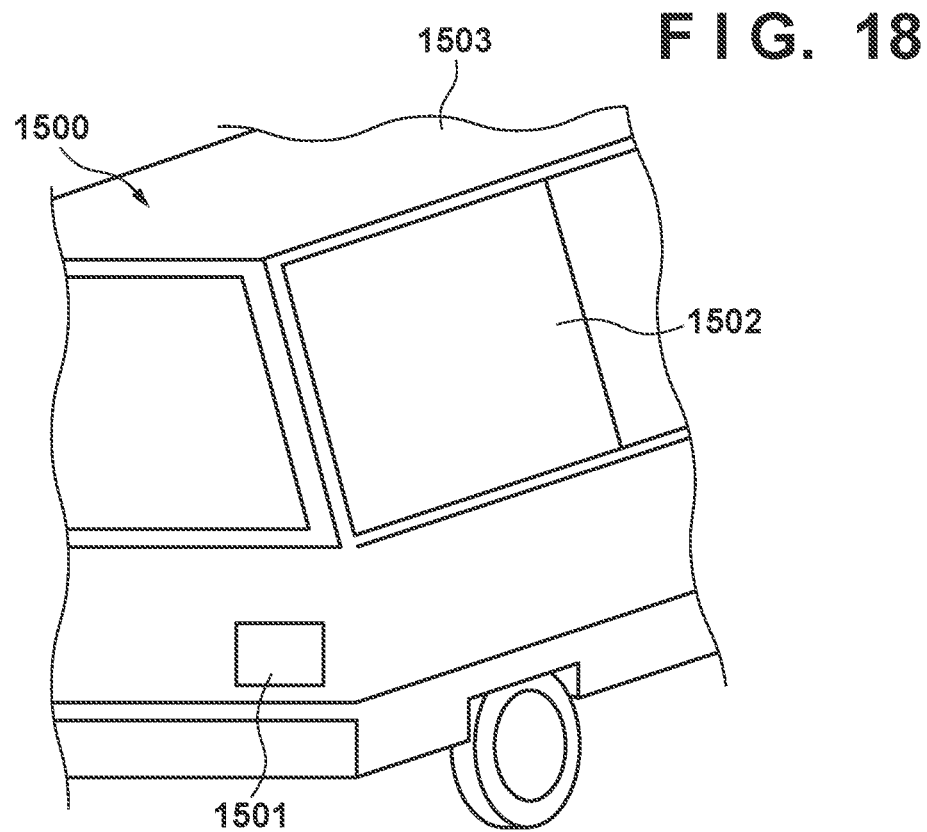
FIG. 18 is a view showing an example of a moving body using the light emitting device according to the embodiment.

FIG. 18 is a schematic view showing an automobile including a tail lamp which is an example of the lighting unit for an automobile using the light emitting device 101 according to this embodiment. An automobile 1500 includes a tail lamp 1501, and may turn on the tail lamp 1501 when a brake operation or the like is performed. The light emitting device 101 according to this embodiment may be used in a head lamp as the lighting unit for an automobile. The automobile is an example of a moving body, and the moving body may be a ship, a drone, an aircraft, a railroad car, an industrial robot, or the like. The moving body may include a body and a lighting unit provided in the body. The lighting unit may inform the current position of the body.

The light emitting device 101 according to this embodiment can be applied to the tail lamp 1501. The tail lamp 1501 may include a protective member that protects the light emitting device 101 which functions as the tail lamp 1501. The protective member has a certain degree of strength, and can be made from any material as long as it is transparent. The protective member may be made from polycarbonate or the like. Further, the protective member may be made from polycarbonate mixed with furandicarboxylic acid derivative, acrylonitrile derivative, or the like.

The automobile 1500 may include a body 1503 and windows 1502 attached thereto. The window may be a window for checking the front or rear of the automobile, or may a transparent display such as a head-up display. The light emitting device 101 according to this embodiment may be used in the transparent display. In this case, the components such as the electrodes included in the light emitting device 101 are formed by transparent members.

Figure 19A:
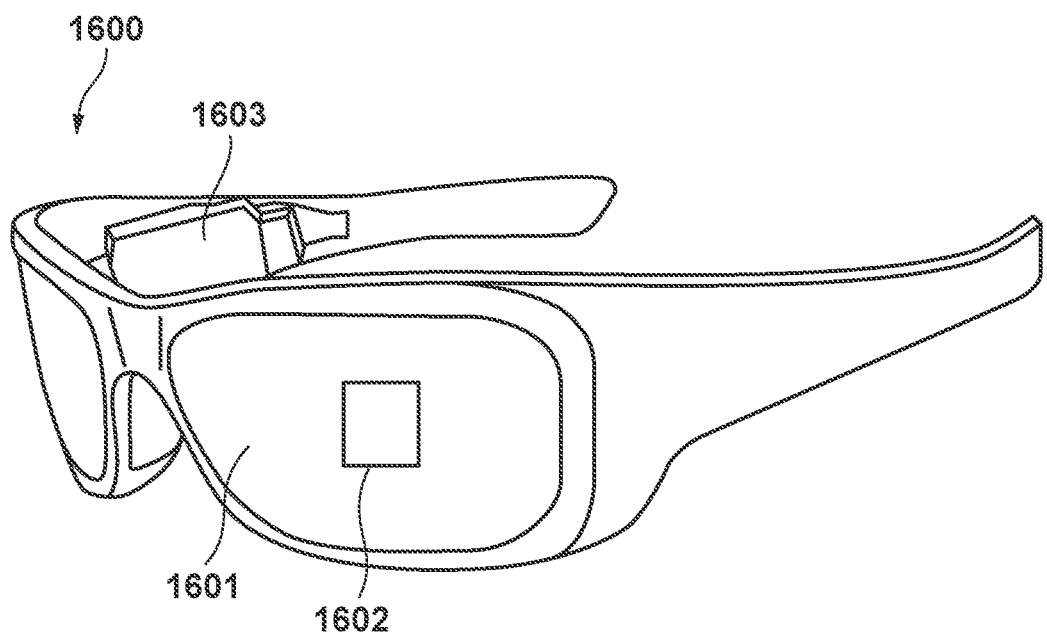
FIGS. 19A and 19B are views each showing an example of a wearable device using the light emitting device according to the embodiment.
Figure 19B:
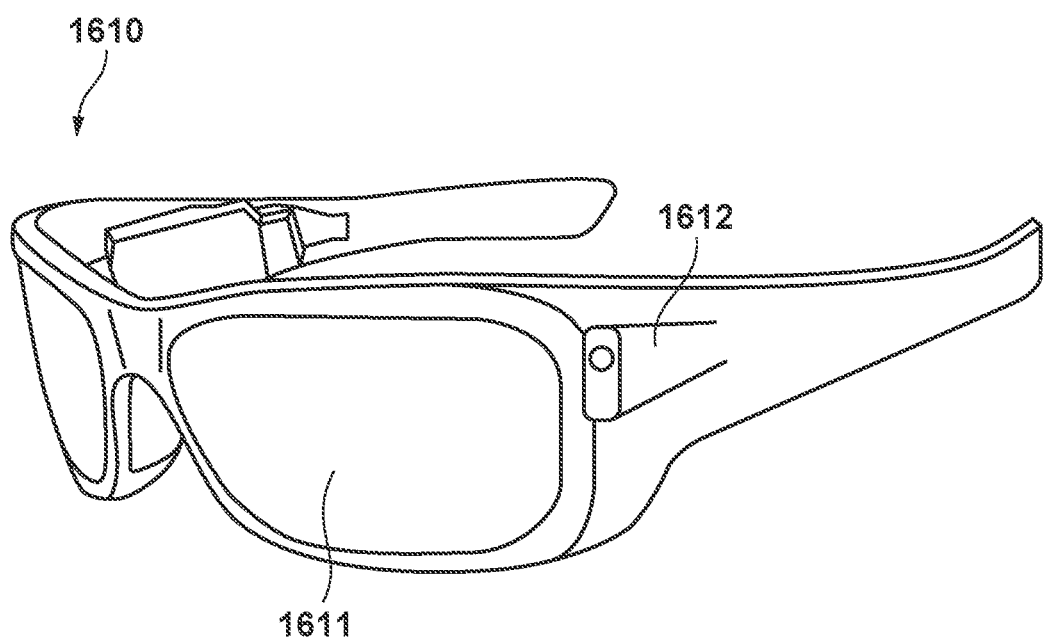

Further application examples of the light emitting device 101 according to this embodiment will be described with reference to FIGS. 19A and 19B. The light emitting device 101 can be applied to a system that can be worn as a wearable device such as smartglasses, a Head Mounted Display (HMD), or a smart contact lens. An image capturing display device used for such application examples includes an image capturing device capable of photoelectrically converting visible light and a light emitting device capable of emitting visible light.

Glasses 1600 (smartglasses) according to one application example will be described with reference to FIG. 19A. An image capturing device 1602 such as a CMOS sensor or an SPAD is provided on the surface side of a lens 1601 of the glasses 1600. In addition, the light emitting device 101 according to this embodiment is provided on the back surface side of the lens 1601.

The glasses 1600 further include a control device 1603. The control device 1603 functions as a power supply that supplies electric power to the image capturing device 1602 and the light emitting device 101 according to each embodiment. In addition, the control device 1603 controls the operations of the image capturing device 1602 and the light emitting device 101. An optical system configured to condense light to the image capturing device 1602 is formed on the lens 1601.

Glasses 1610 (smartglasses) according to one application example will be described with reference to FIG. 19B. The glasses 1610 include a control device 1612, and an image capturing device corresponding to the image capturing device 1602 and the light emitting device 101 are mounted on the control device 1612. The image capturing device in the control device 1612 and an optical system configured to project light emitted from the light emitting device 101 are formed in a lens 1611, and an image is projected to the lens 1611. The control device 1612 functions as a power supply that supplies electric power to the image capturing device and the light emitting device 101, and controls the operations of the image capturing device and the light emitting device 101. The control device 1612 may include a line-of-sight detection unit that detects the line of sight of a wearer. The detection of a line of sight may be done using infrared rays. An infrared ray emitting unit emits infrared rays to an eyeball of the user who is gazing at a displayed image. An image capturing unit including a light receiving element detects reflected light of the emitted infrared rays from the eyeball, thereby obtaining a captured image of the eyeball. A reduction unit for reducing light from the infrared ray emitting unit to the display unit in a planar view is provided, thereby reducing deterioration of image quality.

The line of sight of the user to the displayed image is detected from the captured image of the eyeball obtained by capturing the infrared rays. An arbitrary known method can be applied to the line-of-sight detection using the captured image of the eyeball. As an example, a line-of-sight detection method based on a Purkinje image obtained by reflection of irradiation light by a cornea can be used.

More specifically, line-of-sight detection processing based on pupil center corneal reflection is performed. Using pupil center corneal reflection, a line-of-sight vector representing the direction (rotation angle) of the eyeball is calculated based on the image of the pupil and the Purkinje image included in the captured image of the eyeball, thereby detecting the line-of-sight of the user.

The light emitting device 101 according to the embodiment of the present disclosure can include an image capturing device including a light receiving element, and control a displayed image based on the line-of-sight information of the user from the image capturing device.

More specifically, the light emitting device 101 decides a first visual field region at which the user is gazing and a second visual field region other than the first visual field region based on the line-of-sight information. The first visual field region and the second visual field region may be decided by the control device of the light emitting device 101, or those decided by an external control device may be received. In the display region of the light emitting device 101, the display resolution of the first visual field region may be controlled to be higher than the display resolution of the second visual field region. That is, the resolution of the second visual field region may be lower than that of the first visual field region.

In addition, the display region includes a first display region and a second display region different from the first display region, and a region of higher priority is decided from the first display region and the second display region based on line-of-sight information. The first display region and the second display region may be decided by the control device of the light emitting device 101, or those decided by an external control device may be received. The resolution of the region of higher priority may be controlled to be higher than the resolution of the region other than the region of higher priority. That is, the resolution of the region of relatively low priority may be low.

Note that AI may be used to decide the first visual field region or the region of higher priority. The AI may be a model configured to estimate the angle of the line of sight and the distance to a target ahead the line of sight from the image of the eyeball using the image of the eyeball and the direction of actual viewing of the eyeball in the image as supervised data. The AI program may be held by the light emitting device 101, the image capturing device, or an external device. If the external device holds the AI program, it is transmitted to the light emitting device 101 via communication.

When performing display control based on line-of-sight detection, smartglasses further including an image capturing device configured to capture the outside can be applied. The smartglasses can display captured outside information in real time.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2023-041080, filed Mar. 15, 2023, which is hereby incorporated by reference herein in its entirety.

What is claimed is:

1. A light emitting device comprising:
   a pixel that includes (1) a current path including a light emitting element and a driving transistor configured to supply a current corresponding to a luminance signal to the light emitting element,
   (2) a capacitive element arranged between a gate and a source of the driving transistor,
   (3) a first switching transistor arranged between the current path and a first power supply line configured to supply a current to the light emitting element,
   (4) a second switching transistor arranged between the current path and a second power supply line configured to supply a current to the light emitting element, and
   (5) a write transistor configured to write the luminance signal in the gate,
   wherein a potential of the first power supply line is lower than a potential of the second power supply line,
   wherein one frame period includes a write period in which the write transistor is rendered conductive to write the luminance signal in the gate, and a light emission period in which the light emitting element is caused to emit light after the write period,
   wherein in the write period, the second switching transistor is rendered conductive while the write transistor is rendered conductive, and
   wherein in the light emission period, the first switching transistor keeps in a conductive state.

2. The device according to claim 1, wherein in the pixel, a maximum wiring width of the first power supply line is larger than a maximum wiring width of the second power supply line.

3. The device according to claim 2, wherein in the pixel, the first power supply line and the second power supply line are arranged in the same wiring layer.

4. The device according to claim 3, wherein in the pixel, the second power supply line extends along a direction in which the first power supply line extends.

5. The device according to claim 2, wherein in the pixel, the first power supply line and the second power supply line are arranged in different wiring layers.

6. The device according to claim 5, wherein in the pixel, the first power supply line and the second power supply line extend in intersecting directions.

7. The device according to claim 1, further comprising a pixel array portion where a plurality of pixels including the pixel are arranged so as to form rows and columns,
   wherein, in the light emission period, a current is supplied to the light emitting element arranged in each of the plurality of pixels from one of the first power supply line and the second power supply line for each row.

8. The device according to claim 7, further comprising a control circuit and a memory,
   wherein the memory stores capacitance data based on a capacitance value of the capacitive element, and
   wherein in the light emission period, the control circuit controls, based on the capacitance data, such that a current is supplied to the light emitting element arranged in each of the plurality of pixels from one of the first power supply line and the second power supply line for each row.

9. The device according to claim 8, wherein the capacitance value of the capacitive element of a pixel arranged in a first row among the plurality of pixels is larger than the capacitance value of the capacitive element of a pixel arranged in a second row different from the first row among the plurality of pixels, and wherein in the light emission period, the control circuit controls such that (1) a current is supplied from the first power supply line to the light emitting element of the pixel arranged in the first row among the plurality of pixels, and (2) a current is supplied from the second power supply line to the light emitting element of the pixel arranged in the second row among the plurality of pixels.

10. The device according to claim 1, wherein in the current path, an anode of the light emitting element and a drain of the driving transistor are connected, and wherein the pixel further includes a reset transistor configured to reset, to a predetermined potential, a node to which the anode and the drain are connected.

11. The device according to claim 1, wherein the pixel further includes another capacitive element which is different from the capacitive element and which is arranged between the second power supply line and a node connecting the source and the capacitive element.

12. A display device comprising the light emitting device according to claim 1, and an active element connected to the light emitting device.

13. A photoelectric conversion device comprising (1) an optical unit including a plurality of lenses, (2) an image sensor configured to receive light having passed through the optical unit, and (3) a display unit configured to display an image, wherein the display unit displays an image captured by the image sensor, and includes the light emitting device according to claim 1.

14. An electronic apparatus comprising (1) a housing provided with a display unit, and (2) a communication unit provided in the housing and configured to perform external communication, wherein the display unit includes the light emitting device according to claim 1.

15. An illumination device comprising a light source, and at least one of a light diffusing unit and an optical film, wherein the light source includes the light emitting device according to claim 1.

16. A moving body comprising a main body, and a lighting appliance provided in the main body, wherein the lighting appliance includes the light emitting device according to claim 1.

17. The device according to claim 1, wherein the potential of the first power supply line is higher than a potential of a third power supply line, and wherein the light emitting element is arranged between the driving transistor and the third power supply line.

* * * * *